United States Patent [19]
Sunouchi et al.

[11] Patent Number: 6,025,623
[45] Date of Patent: Feb. 15, 2000

[54] SEMICONDUCTOR DEVICE WITH HIGH INTEGRATION DENSITY AND IMPROVED PERFORMANCE

[75] Inventors: Kazumasa Sunouchi; Masami Aoki, both of Yokohama, Japan

[73] Assignee: Kabushiki Kaisha Toshiba, Kawasaki, Japan

[21] Appl. No.: 08/927,901

[22] Filed: Sep. 11, 1997

[30] Foreign Application Priority Data

Sep. 11, 1996 [JP] Japan ................................. 8-240874
Jun. 27, 1997 [JP] Japan ................................. 9-172451

[51] Int. Cl.[7] ..................... H01L 27/10; H01L 27/108; H01L 29/76; H01L 29/94
[52] U.S. Cl. .................. 257/304; 257/204; 257/303; 257/306; 257/68; 257/71; 257/296
[58] Field of Search ................ 257/68, 71, 296, 257/905, 906, 907, 908, 304, 303, 306, 204

[56] References Cited

U.S. PATENT DOCUMENTS

| | | | |
|---|---|---|---|
| 5,568,422 | 10/1996 | Fujiwara | 257/322 |
| 5,661,340 | 8/1997 | Ema et al. | 257/68 |
| 5,689,120 | 11/1997 | Narita | 257/71 |
| 5,747,844 | 5/1998 | Aoki et al. | 257/296 |
| 5,748,521 | 5/1998 | Lee | 257/296 |
| 5,821,592 | 10/1998 | Hoenigschmid et al. | 257/71 |

*Primary Examiner*—Mahshid Saadat
*Assistant Examiner*—Jesse A. Fenty
*Attorney, Agent, or Firm*—Banner & Witcoff, Ltd.

[57] ABSTRACT

In a stack type memory cell of $8F^2$, bit line plug electrodes for connecting bit lines to source/drain diffusion layers of active regions in an area between two word lines WL are formed extend from the source/drain diffusion layers in parallel to the word lines WL and formed longer than the minimum element isolation width F and shorter than three times the minimum element isolation width F. Thus, a DRAM which uses stack type memory cells and whose integration density can be easily enhanced can be attained.

5 Claims, 28 Drawing Sheets

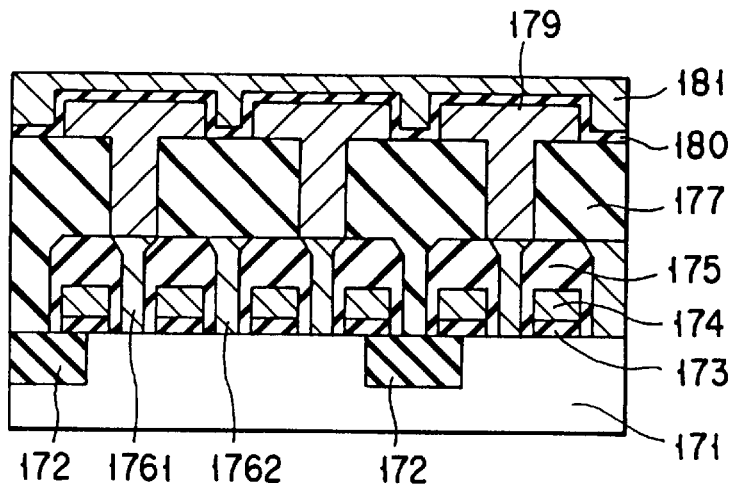
(PRIOR ART) FIG. 7A
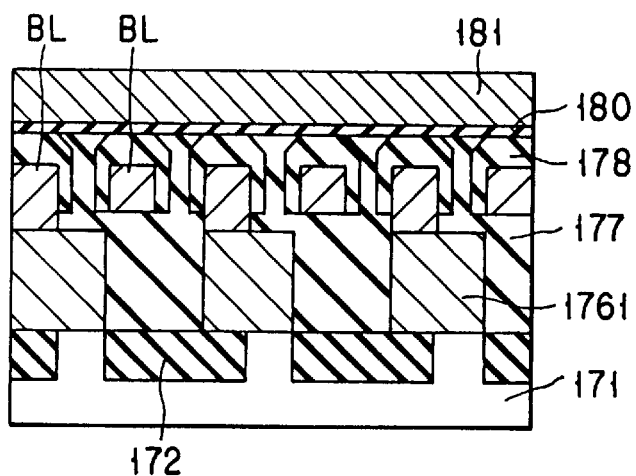
(PRIOR ART) FIG. 7B
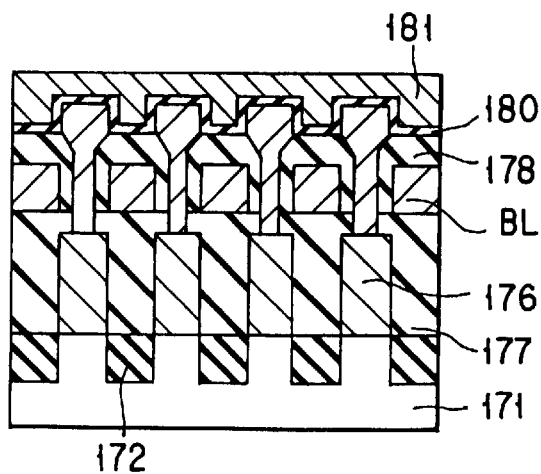
(PRIOR ART) FIG. 7C

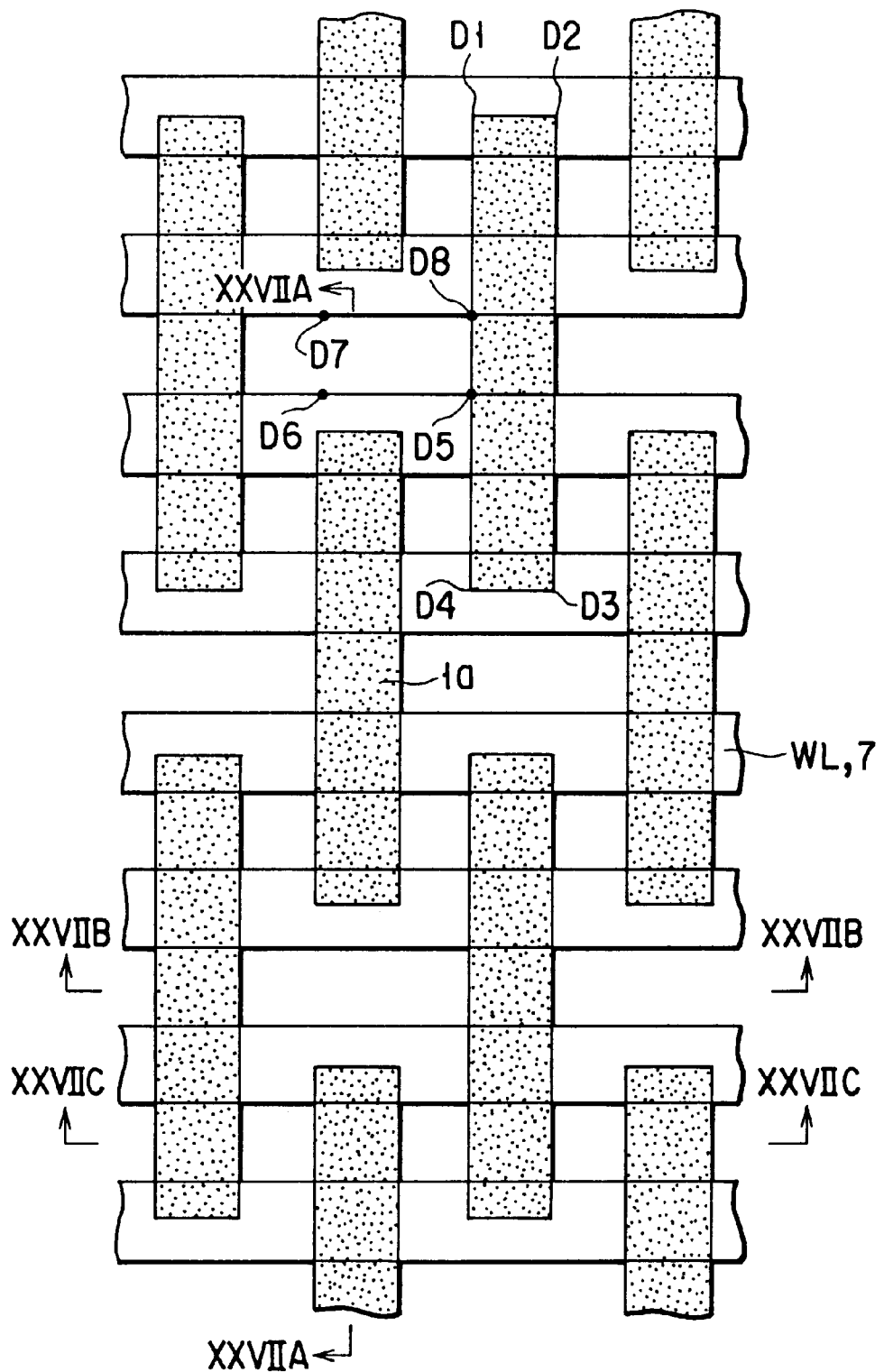
F I G. 13

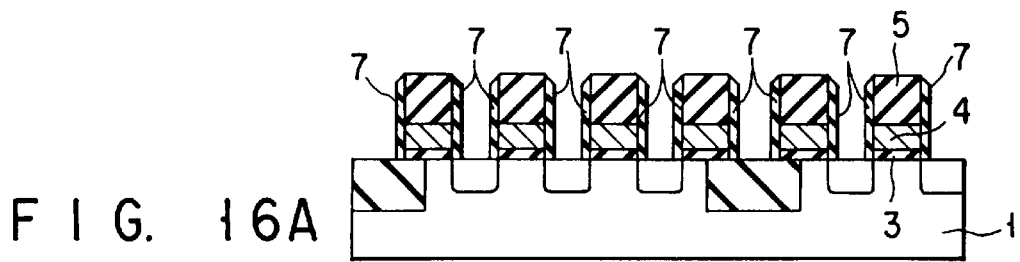
F I G. 16A
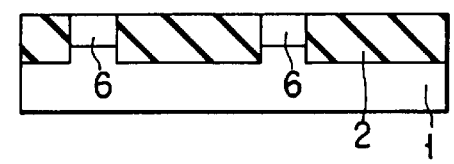
F I G. 16B
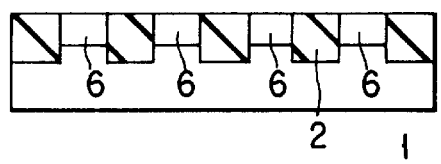
F I G. 16C
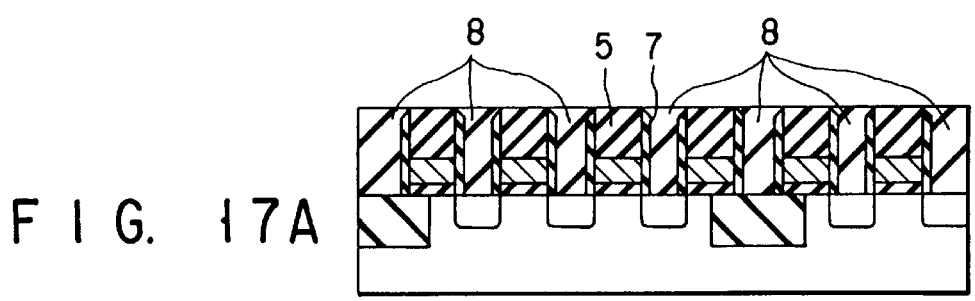
F I G. 17A
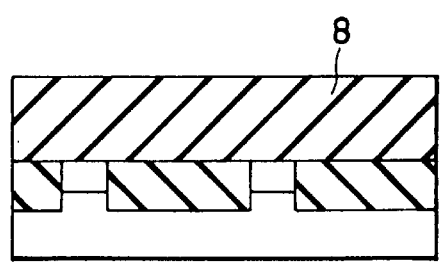
F I G. 17B
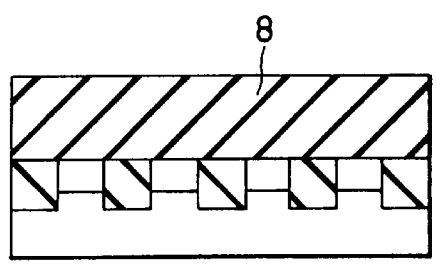
F I G. 17C

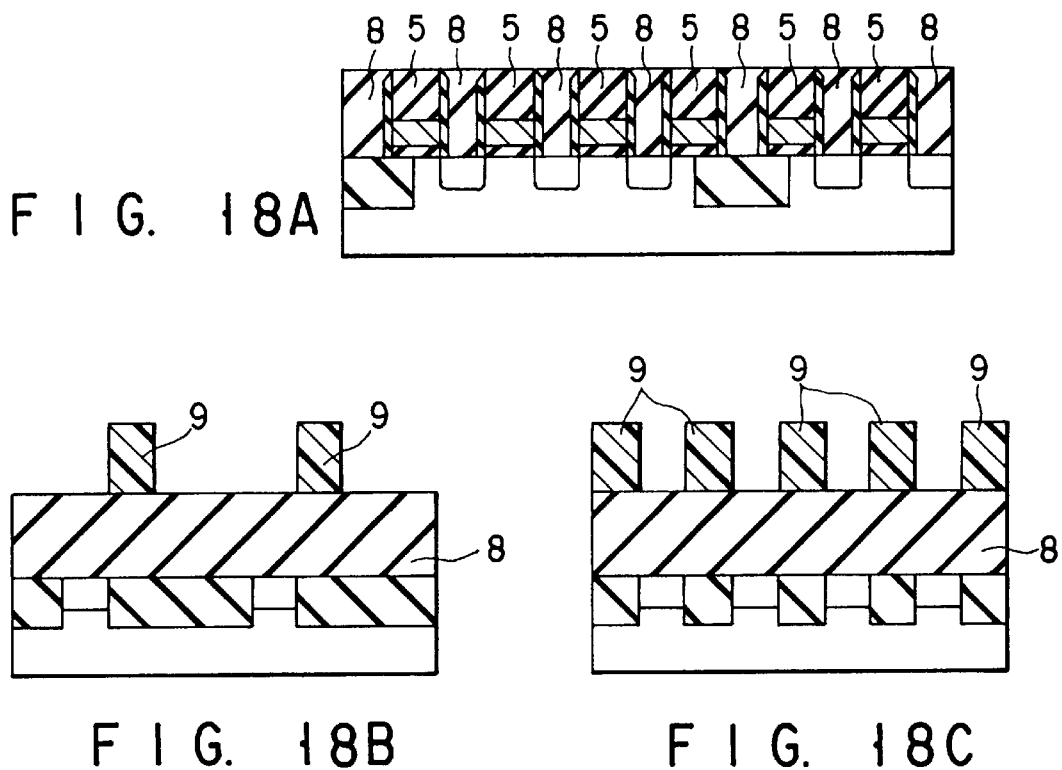
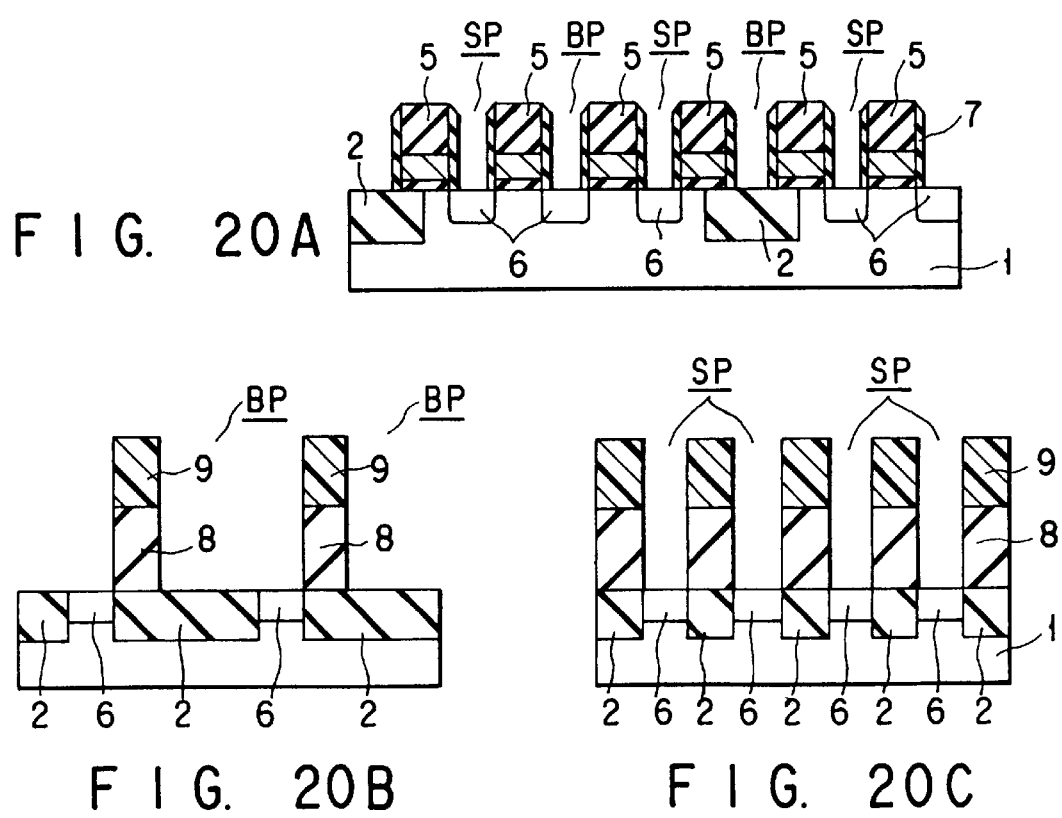

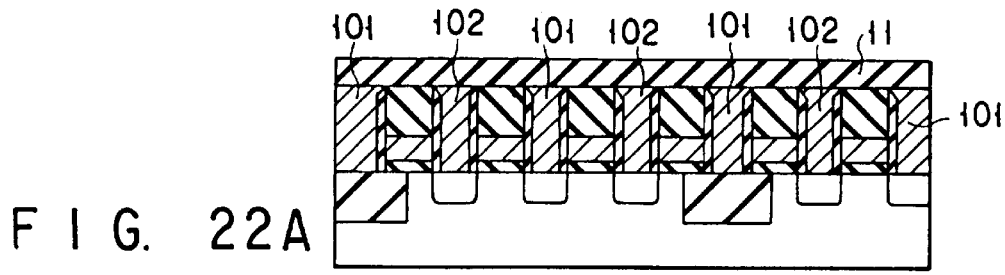
FIG. 22A
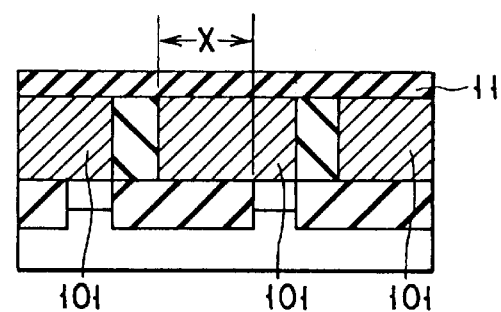
FIG. 22B
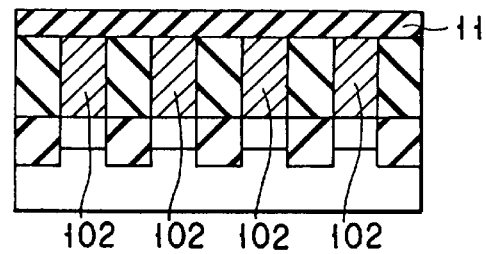
FIG. 22C
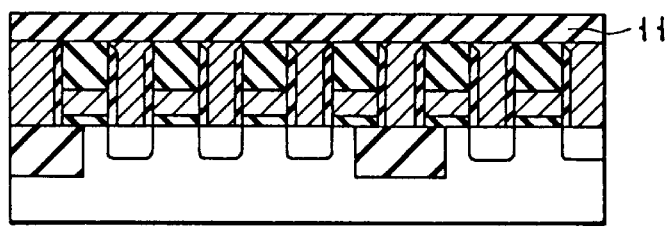
FIG. 23A
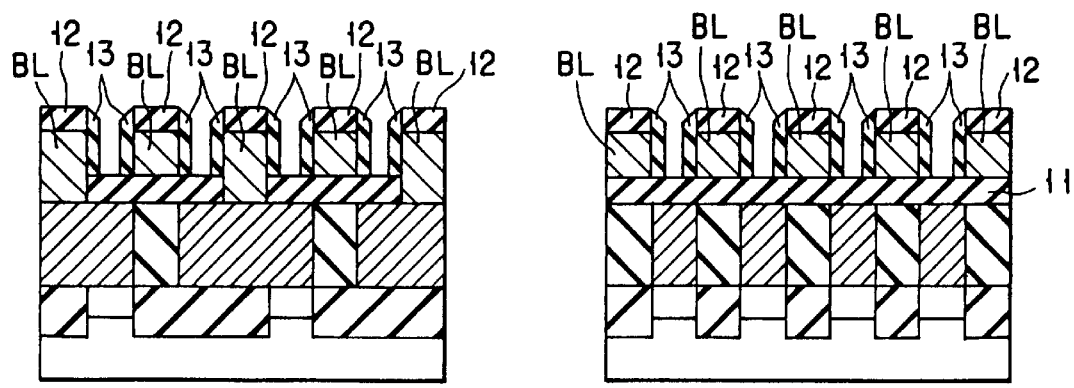
FIG. 23B
FIG. 23C

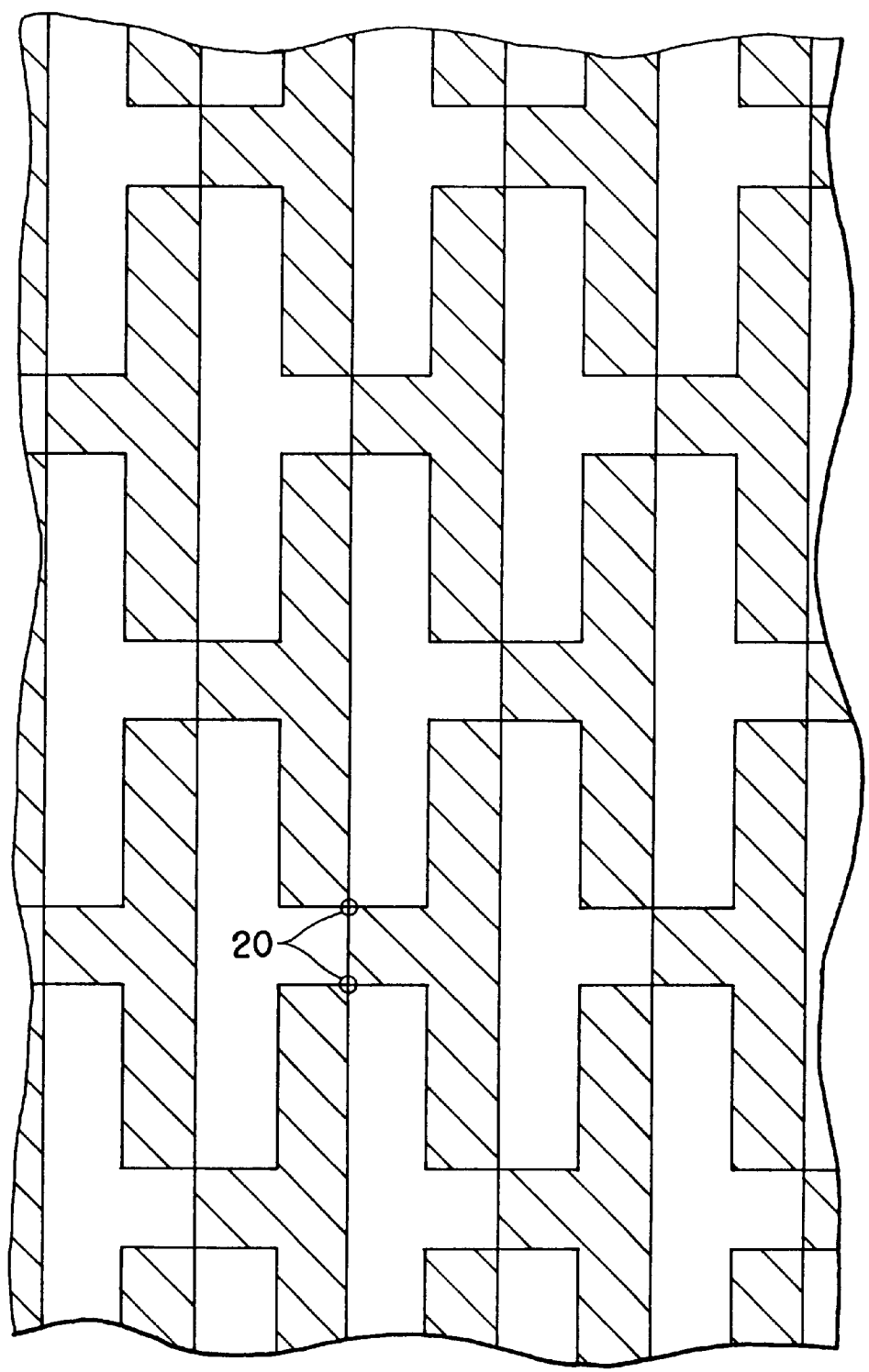
F I G. 30

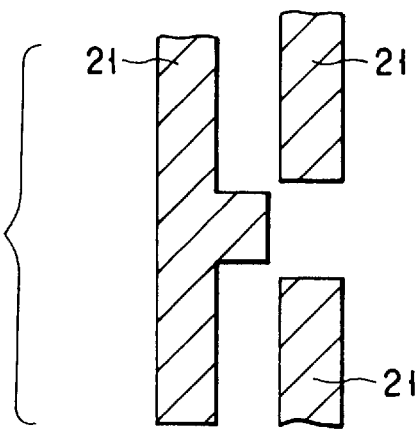
F I G. 32
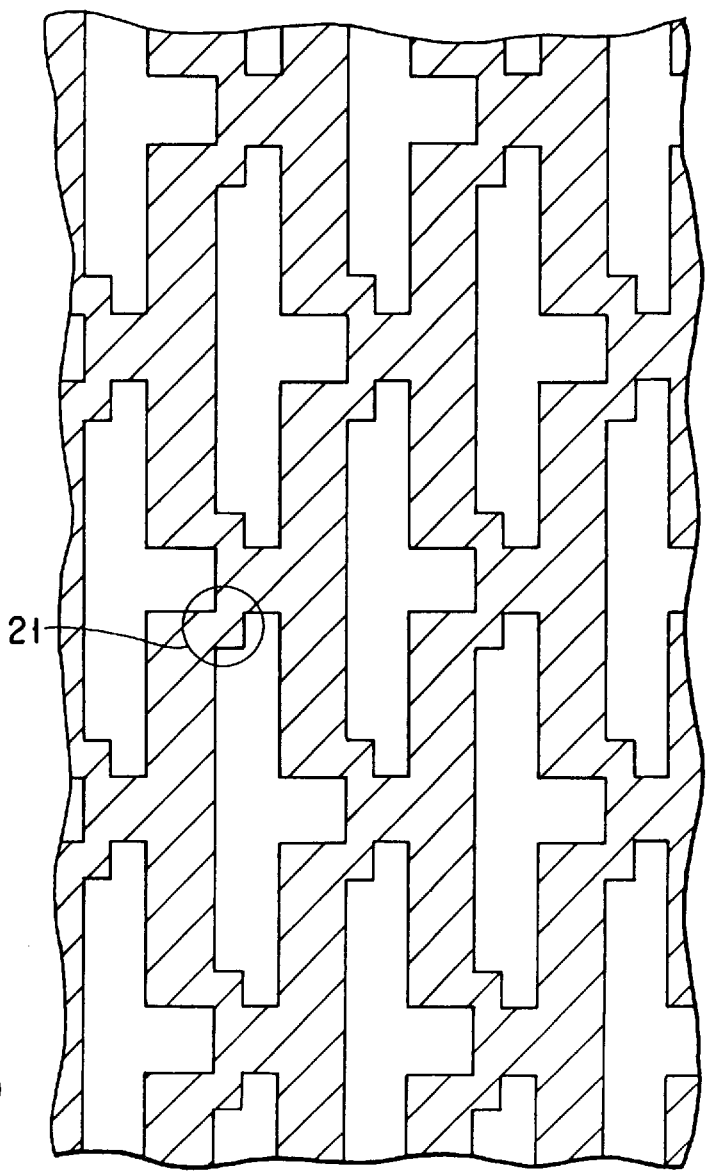
F I G. 33

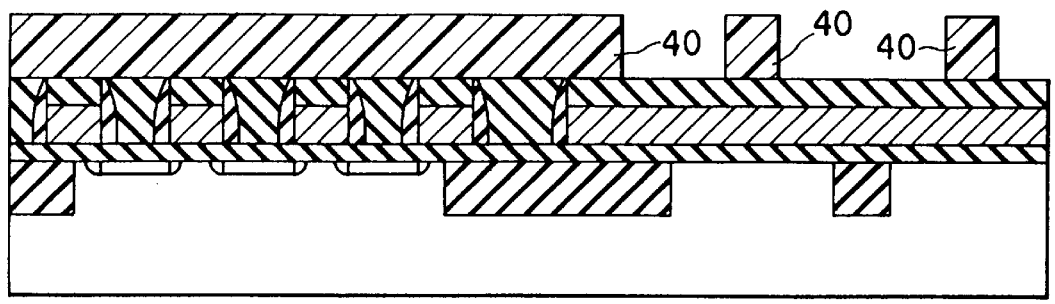
F I G. 37A
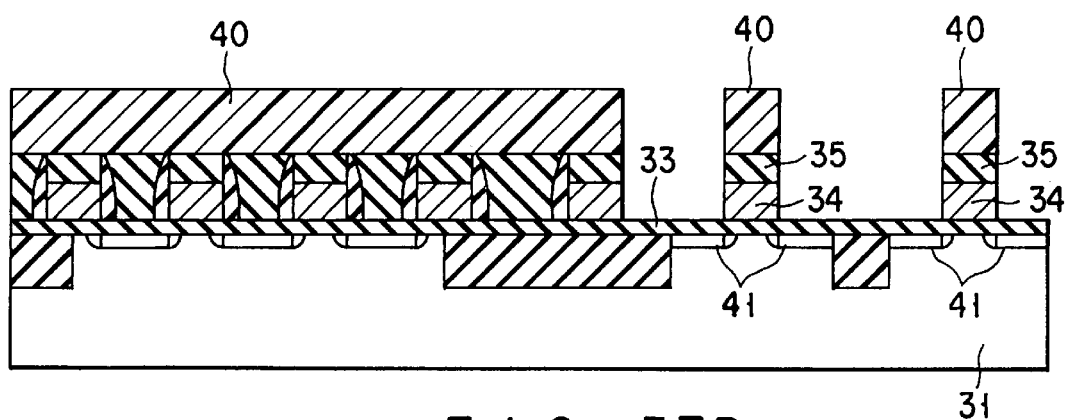
F I G. 37B
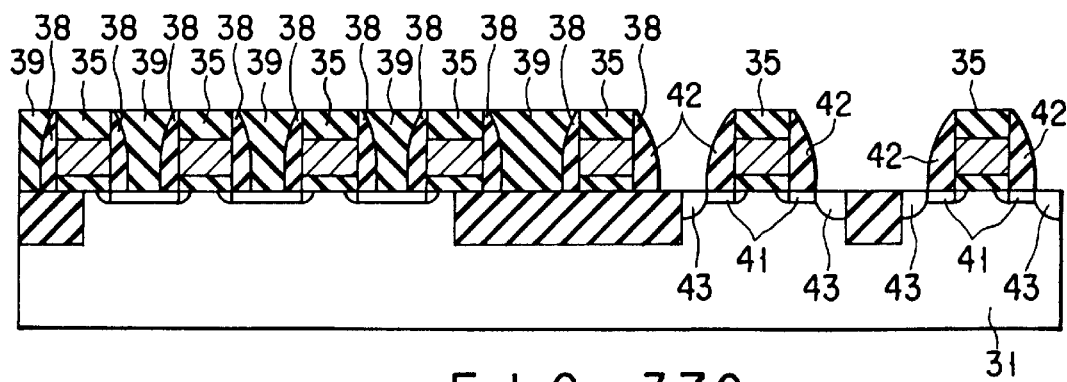
F I G. 37C

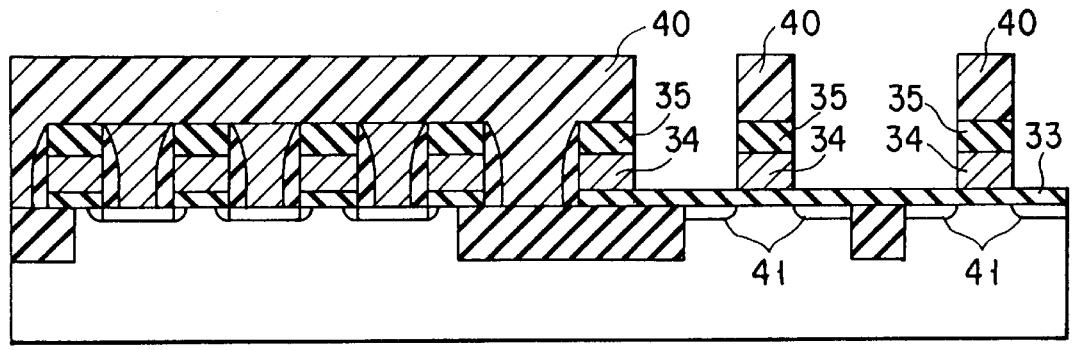
F I G. 40A
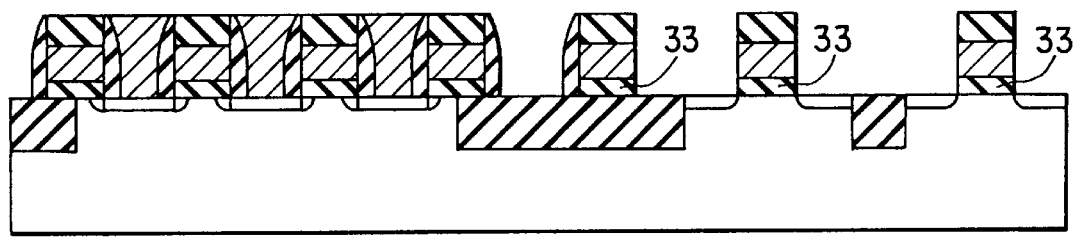
F I G. 40B
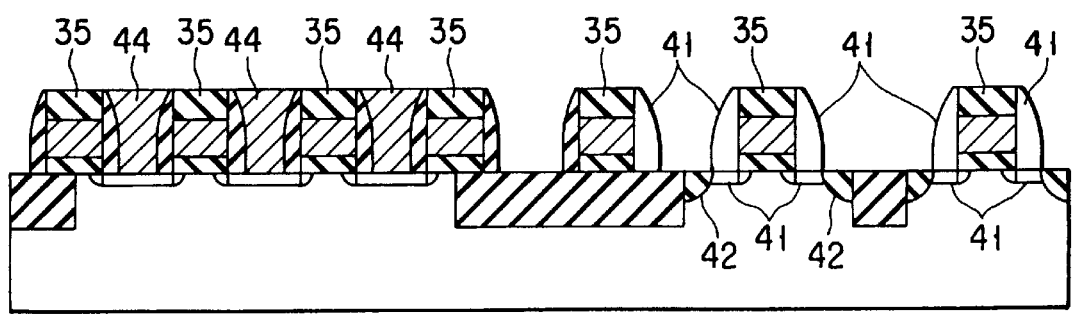
F I G. 40C

SEMICONDUCTOR DEVICE WITH HIGH INTEGRATION DENSITY AND IMPROVED PERFORMANCE

BACKGROUND OF THE INVENTION

The present invention relates to a semiconductor device having a plurality of active region groups and contact areas formed for each of the plurality of active region groups and a method for manufacturing the same. Further, the present invention relates to a semiconductor device which has first and second regions having a plurality of MOS transistors formed and arranged therein and in which distances between gate electrodes and impurity concentrations of diffusion layers are different in the first and second regions and a method for manufacturing the same.

The integration density and the capacity of a semiconductor memory device are steadily increased. Particularly, the integration density of a DRAM having memory cells each constructed by one MOS transistor and one capacitor is most rapidly increased because of the memory cell form thereof.

With an increase in the integration density, the area of a memory cell continues to be reduced. As a result, in the DRAM, the area of the charge storage electrode is reduced and the amount of storage charges is reduced, thereby making it difficult to correctly read out a memory signal. Further, it becomes difficult to control the MOS transistor region and element isolation region.

In order to solve the above problem, a DRAM using memory cells (stack type memory cells) each having a structure in which storage charge electrodes are formed on bit lines is proposed. FIG. 1 is a plan view showing the above type of conventional DRAM, and FIGS. 2A to 2C are cross sectional views of the DRAM. FIG. 2A is a cross sectional view taken along a line extending across the active regions and in parallel to the bit line, FIG. 2B is a cross sectional view taken along a line extending across bit line plug electrodes and in parallel to the word line WL, and FIG. 2C is a cross sectional view taken along a line extending across storage charge plug electrodes and in parallel to the word line WL.

In the drawings, 171 denotes a silicon substrate, 171a an active region, 172 an element isolation insulating film, 173 a gate insulating film, 174 a gate electrode, 175 a gate upper/side-wall insulating film, 1761 a bit line plug electrode, 1762 a storage charge plug electrode, 177 an inter-level insulating film, 178 a bit line upper/side-wall insulating film, 179 a storage charge electrode, 180 a capacitor insulating film, and 181 a plate electrode. In the drawing, source and drain electrodes are omitted.

In the above DRAM, the bit line plug electrode 1761 of a pattern as shown in FIG. 3 and the active regions 171a of a pattern as shown in FIG. 4 are used. In FIG. 5, a pattern obtained by superposing them is shown.

In order to form the active regions 171a shown in FIG. 4 by use of a resist pattern, it is necessary to transfer an exposure mask pattern having projecting portions on the resist. However, since it is difficult to accurately transfer the above pattern on the resist, it is impossible to form the memory cells as designed and it is difficult to attain the high integration density.

FIG. 6 is a plan view of a DRAM using other conventional stack type memory cells and FIGS. 7A to 7C are cross sectional views of the DRAM. FIGS. 8 to 10 are views corresponding to FIGS. 3 to 5.

In this type of DRAM, since the active region 171a is rectangular as shown in FIG. 9, a resist pattern can be formed by use of an exposure mask pattern having no projecting portion. However, since the bit line plug electrode 1761 has a projecting portion as shown in FIG. 8, the resist pattern is formed by use of an exposure mask pattern having projecting portions. Therefore, like the former DRAM, it is impossible to form the memory cells as designed and it is difficult to attain the high integration density.

In order to meet the requirement of high integration density and high-speed operation, it is proposed to form the DRAM and a logic device on the same chip. However, if the integration density is further enhanced, it becomes difficult to simultaneously form the DRAM and logic device.

It becomes particularly difficult to simultaneously form MOS transistors of the DRAM and MOS transistors of the logic device. This is because gate side-wall insulating films having different film thicknesses are present. That is, in the MOS transistors in the peripheral area of the DRAM and those of the logic device, the gate side-wall insulating films are made thick in order to enhance the performance thereof, and in the MOS transistors in the memory area of the DRAM, the gate side-wall insulating films are made thin since the wiring pitch (distance between gate electrodes) of the gate wirings (gate electrodes) is small.

In order to solve the above problem, the following process is proposed.

First, as shown in FIG. 11A, insulating films 202 are filled in trenches formed in the surface portion of a p-type silicon substrate 201 by a known method to attain element isolation, and then, gate oxide films 203, gate electrodes 204 and gate cap insulating films 205 are formed in a memory cell area and an area (which is hereinafter referred to as a peripheral area) in which the distance between the gate electrodes is longer than that in the memory cell area.

Next, as shown in FIG. 11B, n-type impurity ion is implanted into the substrate surface with the gate cap insulating films 205 used as a mask so as to form n-type source/drain diffusion layers 206 and then first gate side-wall insulating films 207 with a thickness for the MOS transistors in the memory cell area are formed.

Next, as shown in FIG. 11C, second gate side-wall insulating films 208 are formed to form gate side-wall insulating films with a thickness for the MOS transistors in the peripheral area. That is, the gate side-wall insulating films with a thickness for the MOS transistors in the peripheral area are completed by formation of the first and second gate side-wall insulating films 207, 208. In this case, as a material for the second gate side-wall insulating film 208, a material which does not cause the first gate side-wall insulating film 207 to be made thin at the time of etching of the second gate side-wall insulating film 208 is selected.

Next, as shown in FIG. 1C, n-type source/drain diffusion layers 210 of high impurity concentration are selectively formed in the peripheral area by ion-implantation with the memory cell area covered with a resist pattern 209. After this, the resist pattern 209 is removed.

Then, as shown in FIG. 12A, an inter-level insulating film 211 is formed. For example, a CMP process is effected for planarization for the inter-level insulating film 211.

Next, as shown in FIG. 12B, a resist pattern 212 is formed and the inter-level insulating film 211 on the n-type source/drain regions 206 is selectively etched out with the resist pattern 212 used as a mask, and then, as shown in FIG. 12A, the second gate side-wall insulating films 208 on the n-type source/drain regions 206 is selectively etched out. Thus, the gate side-wall insulating films having different film thicknesses in the memory cell area and in the peripheral area are completed. After this, the resist pattern 212 is removed.

Next, as shown in FIG. 12C, source/drain electrodes 213 are formed in the memory cell area. A concrete method for forming the source/drain electrodes 213 is described below.

First, a conductive film for formation of the source/drain electrodes 213 is formed on the entire surface by a film forming method such as a CVD method. Then, the conductive film is heated to make the surface condition thereof uniform. Finally, the entire surface of the conductive film is etched back or set back to the cap insulating film 205 by a method such as an etching or CMP process. The process effected after the step of forming the source/drain electrodes 213 is the same as the process which is well known in the art.

This type of method has the following problem.

In this method, the n-type source/drain diffusion layers 210 of high impurity concentration are already formed in the peripheral area in the step of forming the inter-level insulating film 211 shown in FIG. 12A.

Therefore, impurity in the n-type source/drain diffusion layers 210 is diffused again (re-diffused) by heat generated at the time of formation of the inter-level insulating film 211, thereby degrading the performance of the MOS transistors in the peripheral area. As a result, for example, there occurs a problem that the operation speed (performance) of the logic device cannot be enhanced. Further, this method has a problem that the process becomes complex in comparison with that of a method for forming gate side-wall insulating films of the same thickness in the memory cell area and in the peripheral area.

The above problems can be summarized as follows.

That is, in the DRAM using the conventional stack type memory cells, it is necessary to use a pattern having a projecting portion which is difficult to be transferred as an exposure mask pattern for forming a resist pattern for formation of bit line plug electrodes or active regions because of the structure thereof and thus it has a problem that the high integration density cannot be easily attained.

Further, in order to attain the high integration density and high performance, a method for forming MOS transistors of the memory cell area and the peripheral area on the same chip is proposed. In this case, the distances between the gate electrodes and the impurity concentrations of the source/drain regions are different in the memory cell area and in the peripheral area, and if an attempt is made to form a semiconductor device with such a structure, impurity in the n-type source/drain regions of high impurity concentration in the peripheral area is re-diffused, thereby degrading the performance of the MOS transistors in the peripheral area and making it impossible to enhance the performance of the device.

BRIEF SUMMARY OF THE INVENTION

Accordingly, it is an object of the present invention to provide a semiconductor device which is suitable for high integration and has a plurality of active region groups and contact areas formed for each of the plurality of active region groups and a method for manufacturing the same.

Further, it is another object of the present invention to provide a semiconductor device which has first and second element regions having a plurality of MOS transistors formed and arranged therein and in which distances between gate electrodes are different in the first and second element regions, diffusion layers of higher impurity concentration are formed in one of the first and second element regions in which the distance between the gate electrodes is set longer, and impurity in the diffusion layer of high impurity concentration can be prevented from being re-diffused during the manufacturing process and a method for manufacturing the same.

According to one aspect of the present invention, there is provided a semiconductor device comprising: a plurality of active region groups regularly arranged on the surface of a semiconductor substrate; an element isolation region formed between the plurality of active region groups; a plurality of wiring groups arranged in parallel to one another on and intersecting the plurality of active region groups; a first insulating film formed to selectively cover the plurality of wiring groups; and a second insulating film formed to fill spaces between the plurality of wiring groups; wherein the plurality of active region groups are arranged and shifted from one another in the array direction of the plurality of wiring groups by a deviation amount of 1/n (n>1) of a distance between the plurality of active region groups in a direction in which the plurality of wiring groups extend, contact areas for each of the plurality of active region groups are each formed in an area extending in a projection form from each of the plurality of active region groups in a direction in which the plurality of wiring groups extend between adjacent wirings among the plurality of wiring groups, the second insulating film has openings on the contact areas and on areas of the plurality of active region groups between the plurality of wiring groups, contact electrode wiring layers are formed to fill the openings on the contact areas, and the length X of the area extending in the projection form in the contact area in the direction in which the plurality of wiring groups extend satisfies the relation of $L_1<X<2L_1+L_2$ when the width of each of the element isolation regions in the direction in which the plurality of wiring groups extend is set to $L_1$ and the width of one of the plurality of active regions in the above direction is set to $L_2$.

In the device, each of the plurality of active region groups may include source/drain regions of MOS transistors, the plurality of wiring groups include word lines, the contact electrode wiring layer is an electrode wiring layer for setting bit lines in contact with the contact areas.

Moreover, each of the plurality of active region groups may include at least two MOS transistors, a corresponding one of the contact areas is formed to be electrically connected to a common source/drain region of the two MOS transistors and a stack type capacitor is electrically connected to the other source/drain region of the MOS transistors.

According to another aspect of the present invention, there is provided a method for forming a semiconductor device which has a plurality of active region groups regularly arranged on the surface of a semiconductor substrate, and a plurality of wiring groups arranged in parallel to one another on and intersecting the plurality of active region groups and in which the plurality of active region groups are arranged and shifted from one another in the array direction of the plurality of wiring groups by a deviation amount of 1/n (n>1) of a distance between the plurality of active region groups in a direction in which the plurality of wiring groups extend and contact areas for each of the plurality of active region groups are each formed in an area extending in a projection form from each of the plurality of active region groups in a direction in which the plurality of wiring groups extend between adjacent wirings among the plurality of wiring groups, comprising the steps of: selectively covering the plurality of wiring groups with a first insulating film; filling a second insulating film in spaces between the plurality of wiring groups; forming a resist on the first and second insulating films and forming a resist pattern by exposing and developing the resist; selectively etching the second insulating film with respect to the first insulating film with the resist pattern used as a mask to form contact holes for the contact areas of the plurality of active region groups in the second insulating film; and forming a contact electrode wiring layer to fill the contact holes; wherein the resist pattern is formed by removing portions of the resist lying on the plurality of active region groups and the contact areas and on an area between the contact area of each of the active regions of the plurality of active region groups and another active region adjacent to the active region on the side of the projecting portion and shifted from the active region by a deviation amount of 1/n (n>1) of a distance between the plurality of active region groups in a direction in which the plurality of wiring groups extend.

In this method, each of the plurality of active region groups may include source/drain regions of MOS transistors, the plurality of wiring groups include word lines, the contact electrode wiring layer is an electrode wiring layer for setting bit lines in contact with the contact areas.

Moreover, each of the plurality of active region groups may include at least two MOS transistors, a corresponding one of the contact areas is formed to be electrically connected to a common source/drain region of the two MOS transistors and a stack type capacitor is electrically connected to the other source/drain region of the MOS transistors.

Moreover, the resist pattern may be formed by removing portions of the resist lying on an area between two active regions which are adjacent to each other in a direction in which the projecting portion extends and shifted from the active region by a deviation amount of 1/n (n>1) of a distance between the plurality of active region groups in a direction in which the plurality of wiring groups extend.

Moreover, the resist pattern may include a plurality of rectangular patterns separated from one another and the rectangular patterns are arranged in an array form and in parallel to one another and intersect the plurality of wiring groups.

Moreover, the rectangular patterns may be arranged and shifted from one another by a deviation amount of 1/n (n>1) in the array direction of the plurality of wiring groups.

According to another aspect of the present invention, there is provided a method for forming a semiconductor device which has a plurality of active region groups regularly arranged on the surface of a semiconductor substrate, an element isolation region formed between the plurality of active region groups; and a plurality of wiring groups arranged in parallel to one another on and intersecting the plurality of active region groups and in which the plurality of active region groups are arranged and shifted from one another in the array direction of the plurality of wiring groups by a deviation amount of 1/n (n>1) of a distance between the plurality of active region groups in a direction in which the plurality of wiring groups extend and contact areas for each of the plurality of active region groups are each formed in an area extending in a projection form from each of the plurality of active region groups in a direction in which the plurality of wiring groups extend between adjacent wirings among the plurality of wiring groups, comprising the steps of: selectively covering the plurality of wiring groups with a first insulating film; filling a second insulating film in spaces between the plurality of wiring groups; forming a resist on the first and second insulating films and forming a resist pattern by exposing and developing the resist and removing portions of the resist which lie on the plurality of active region groups and the contact areas; selectively etching the second insulating film with respect to the first insulating film with the resist pattern used as a mask to form contact holes for the contact areas of the plurality of active region groups in the second insulating film; and forming a contact electrode wiring layer to fill the contact holes; wherein the resist pattern is formed by forming the contact areas while the length X of the area extending in the projection form in the contact area in the direction in which the plurality of wiring groups extend is set to satisfy the relation of $L_1<X<2L_1+L_2$ when the width of each of the element isolation regions in the direction in which the plurality of wiring groups extend is set to $L_1$ and the width of one of the plurality of active regions in the above direction is set to $L_2$.

According to another aspect of the present invention, there is provided a semiconductor device comprising: a first area in which a plurality of first MOS transistors are formed and arranged with a first distance between gate electrodes in a channel length direction, wherein first gate side-wall insulating films are formed in direct contact with the side walls of the gate electrode of each of the first MOS transistors; and a second area in which a plurality of second MOS transistors having diffusion layers of impurity concentration higher than that of the first MOS transistors are formed and arranged with a second distance between gate electrodes longer than the first distance between the gate electrodes in the channel length direction, wherein second gate side-wall insulating films which are formed of the same type of film as the first gate side-wall insulating films and thicker than the first gate side-wall insulating films are formed in direct contact with the side walls of the gate electrode of each of the second MOS transistors.

According to another aspect of the present invention, there is provided a semiconductor device comprising: a first area in which a plurality of first MOS transistors are formed and arranged with a first distance between gate electrodes in a channel length direction, wherein first gate side-wall insulating films are formed in direct contact with the side walls of the gate electrode of each of the first MOS transistors; and a second area in which a plurality of second MOS transistors having diffusion layers of impurity concentration higher than that of the first MOS transistors are formed and arranged with a second distance between gate electrodes longer than the first distance between the gate electrodes in the channel length direction, wherein second gate side-wall insulating films which are formed of a different type of film from that of the first gate side-wall insulating films are formed in direct contact with the side walls of the gate electrode of each of the second MOS transistors and the second gate side-wall insulating films are formed on the side walls of the gate electrode of each of the first MOS transistors with the respective first gate side-wall insulating films disposed therebetween.

In this device, the second gate electrode may be formed of a semiconductor film containing impurity and the second gate side-wall insulating film is formed of an insulating film which prevents the impurity of the semiconductor film from penetrating the gate insulating film.

According to another aspect of the present invention, there is provided a method for forming a semiconductor device which has a first area in which a plurality of first MOS transistors are formed and arranged with a first distance between gate electrodes in a channel length direction, and a second area in which a plurality of second MOS transistors having diffusion layers of impurity concentration higher than that of the first MOS transistors are formed and arranged with a second distance between gate electrodes longer than the first distance between the gate electrodes in the channel length direction, comprising the steps of: forming a conductive film on the first and second areas; selectively etching the conductive film on the first area to form and arrange a plurality of first gate electrodes with the first distance between the gate electrodes; selectively doping impurity into the first area between the first gate electrodes to form first diffusion layers; forming first gate side-wall insulating films on the side walls of the first gate electrodes; selectively etching the conductive film on the second area to form and arrange a plurality of second gate electrodes with the second distance between the gate electrodes; selectively doping impurity into the second area between the second gate electrodes to form second diffusion layers; forming second gate side-wall insulating films which are formed thicker than the first gate side-wall insulating films and formed of the same type of film as that of the first gate side-wall insulating films on the side walls of the second gate electrodes; and selectively doping impurity into portions of the second diffusion layers which are not covered with the second gate side-wall insulating films to form third diffusion layers.

This method may further comprise the step of forming source/drain electrodes on the first diffusion layers before forming the second gate electrodes.

Moreover, the method may further comprise the step of selectively forming a conductive film used as source/drain electrodes on the first diffusion layers.

According to another aspect of the present invention, there is provided a method for forming a semiconductor device which has a first area in which a plurality of first MOS transistors are formed and arranged with a first distance between gate electrodes in a channel length direction, and a second area in which a plurality of second MOS transistors having diffusion layers of impurity concentration higher than that of the first MOS transistors are formed and arranged with a second distance between gate electrodes longer than the first distance between the gate electrodes in the channel length direction, comprising the steps of: forming a conductive film on the first and second areas; selectively etching the conductive film on the first area to form and arrange a plurality of first gate electrodes with the first distance between the gate electrodes; selectively doping impurity into the first area between the first gate electrodes to form first diffusion layers; forming first gate side-wall insulating films on the side walls of the first gate electrodes; selectively etching the conductive film on the second area to form and arrange a plurality of second gate electrodes with the second distance between the gate electrodes; selectively doping impurity into the second area between the second gate electrodes to form second diffusion layers; forming second gate side-wall insulating films which are formed thicker than the first gate side-wall insulating films and formed of a different type of film from that of the first gate side-wall insulating films in contact with the side walls of the first and second gate electrodes; and selectively doping impurity into portions of the second diffusion layers which are not covered with the second gate side-wall insulating films to form third diffusion layers.

In this method, the conductive film may be a semiconductor film containing impurity and the second gate side-wall insulating film is formed of an insulating film which prevents the impurity of the semiconductor film from penetrating the gate insulating film.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 7A to 7C are cross sectional views of the DRAM shown in FIG. 6;

FIG. 13 is a plan view of a DRAM using stack type memory cells according to a first embodiment of the present invention;

FIGS. 16A to 16C are cross sectional views for illustrating a step of the method for forming the DRAM of FIG. 13;

FIGS. 17A to 17C are cross sectional views for illustrating a step of the method for forming the DRAM of FIG. 13;

FIGS. 18A to 18C are cross sectional views for illustrating a step of the method for forming the DRAM of FIG. 13;

FIGS. 20A to 20C are cross sectional views for illustrating a step of the method for forming the DRAM of FIG. 13;

FIGS. 22A to 22C are cross sectional views for illustrating a step of the method for forming the DRAM of FIG. 13;

FIGS. 23A to 23C are cross sectional views for illustrating a step of the method for forming the DRAM of FIG. 13;

FIG. 30 is a view showing another exposure mask pattern for forming a resist pattern used for forming the DRAM of FIG. 13;

FIG. 32 is a view for illustrating the effect of the exposure mask pattern of FIG. 30;

FIG. 33 is a view showing still another exposure mask pattern for forming a resist pattern used for forming the DRAM of FIG. 13;

FIGS. 37A to 37C are cross sectional views for illustrating steps in the latter half of the method for forming the MOS transistors of FIG. 35;

FIGS. 40A to 40C are cross sectional views for illustrating steps in the latter half of the method for forming the MOS transistors in the memory cell area and peripheral area in the semiconductor device according to a third embodiment of the present invention.

DETAILED DESCRIPTION OF THE INVENTION

There will now be described embodiments of the present invention with reference to the accompanying drawings.

First Embodiment

FIG. 13 is a plan view showing word lines W and active regions 1a of a DRAM using stack type memory cells according to a first embodiment of the present invention.

Sets of FIGS. 14A to 14C to FIGS. 27A to 27C (except FIGS. 19 and 21) are cross sectional views for illustrating respective steps of a method for forming the DRAM. The three figures of each set respectively correspond in an order from the top to the cross sectional views taken along the lines XXVIIA—XXVIIA, XXVIIB—XXVIIB and XXVIIC—XXVIIC of FIG. 13.

The method for forming the DRAM is described below.

Figure 14A:
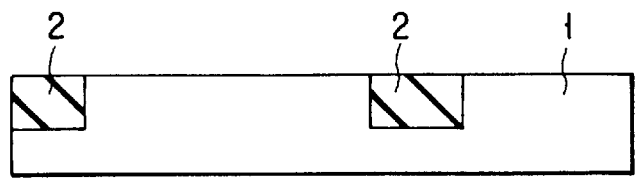
FIGS. 14A to 14C are cross sectional views for illustrating a step of a method for forming the DRAM of FIG. 13.
Figure 14B:
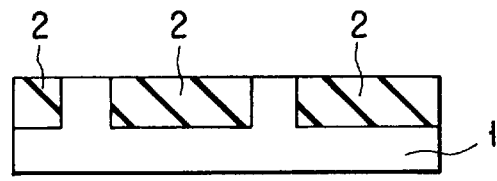
Figure 14C:
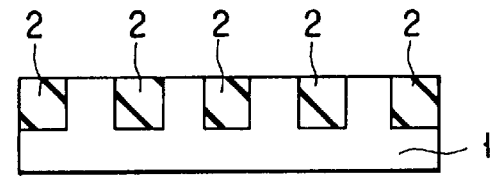

First, in a step shown in FIGS. 14A to 14C, element isolation (STI isolation) is made by forming shallow trenches in a silicon substrate 1 of one conductivity type and filling element isolation insulating films 2 in the trenches. In FIG. 13, a plane pattern of active regions 1a of MOS transistors formed in this step is shown. That is, the active regions 1a are arranged in such an array form that memory cells (for example, an area defined by sequentially connecting points D1 to D8 in FIG. 13) having an area of $8F^2$ can be formed.

Figure 15A:
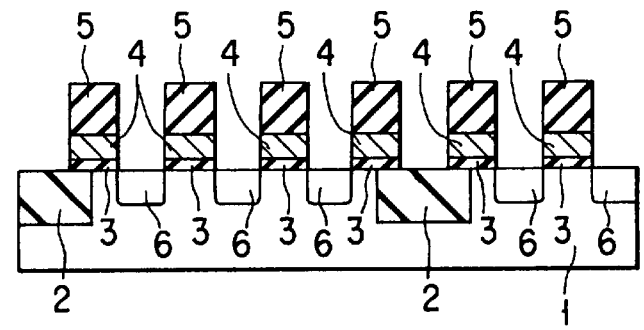
FIGS. 15A to 15C are cross sectional views for illustrating a step of the method for forming the DRAM of FIG. 13.
Figure 15B:
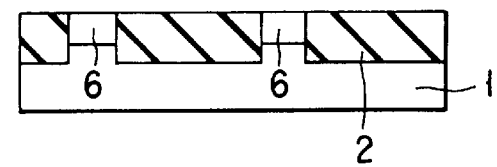
Figure 15C:
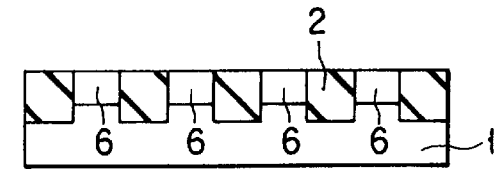

Next, as shown in FIGS. 15A to 15C, gate oxide films 3, gate electrodes 4 integrally formed with word lines WL, and gate upper-side insulating films 5 are formed in this order on the surface of the silicon substrate 1. This process is effected as follows.

First, an oxide film used for forming the gate oxide films 3 is formed by oxidizing the surface of the substrate, then a conductive film such as a polysilicon film containing impurity therein and used for forming the word lines WL and gate electrodes 4 and a first insulating film such as a silicon nitride film used for forming the gate upper-side insulating films 5 are formed in this order on the oxide film, and the thus formed laminated film is patterned to form the gate oxide films 3, word lines WL (gate electrodes 4) and gate upper-side insulating films 5 of a preset shape.

After this, impurity ion is implanted into the substrate surface with the gate upper-side insulating films 5 used as a mask so as to form source/drain diffusion layers 6 of a conductivity type opposite to that of the silicon substrate 1 in a self-alignment manner.

Next, as shown in FIGS. 16A to 16C, a second insulating film such as a silicon nitride film used for forming gate side-wall insulating films 7 is formed on the entire surface, then the entire surface of the second insulating film is subjected to the RIE process to selectively leave the second insulating film on the side walls of the gate portions 3, 4, 5 so as to form the gate side-wall insulating films 7.

Next, as shown in FIGS. 17A to 17C, a first inter-level insulating film 8 is formed to a height equal to the height of the gate upper-side insulating film 5 on the entire surface of the structure to fill spaces between the gate side-wall insulating films 7. The height of the upper surface of the first inter-level insulating film 8 is not necessarily set equal to the height of the upper surface of the gate upper-side insulating film 5 and may be set slightly higher or lower than the latter. The inter-level insulating films 8 can be formed by, for example, forming a third insulating film for the inter-level insulating films 8 to a certain thickness on the entire surface and then polishing the entire surface of the third insulating film until the surfaces of the gate upper-side insulating films 5 are exposed. In this case, as a material of the inter-level insulating film 8, a material whose etching rate is higher than that of the gate upper-side insulating film 5 and the gate side-wall insulating film 7 is used.

Figure 19:
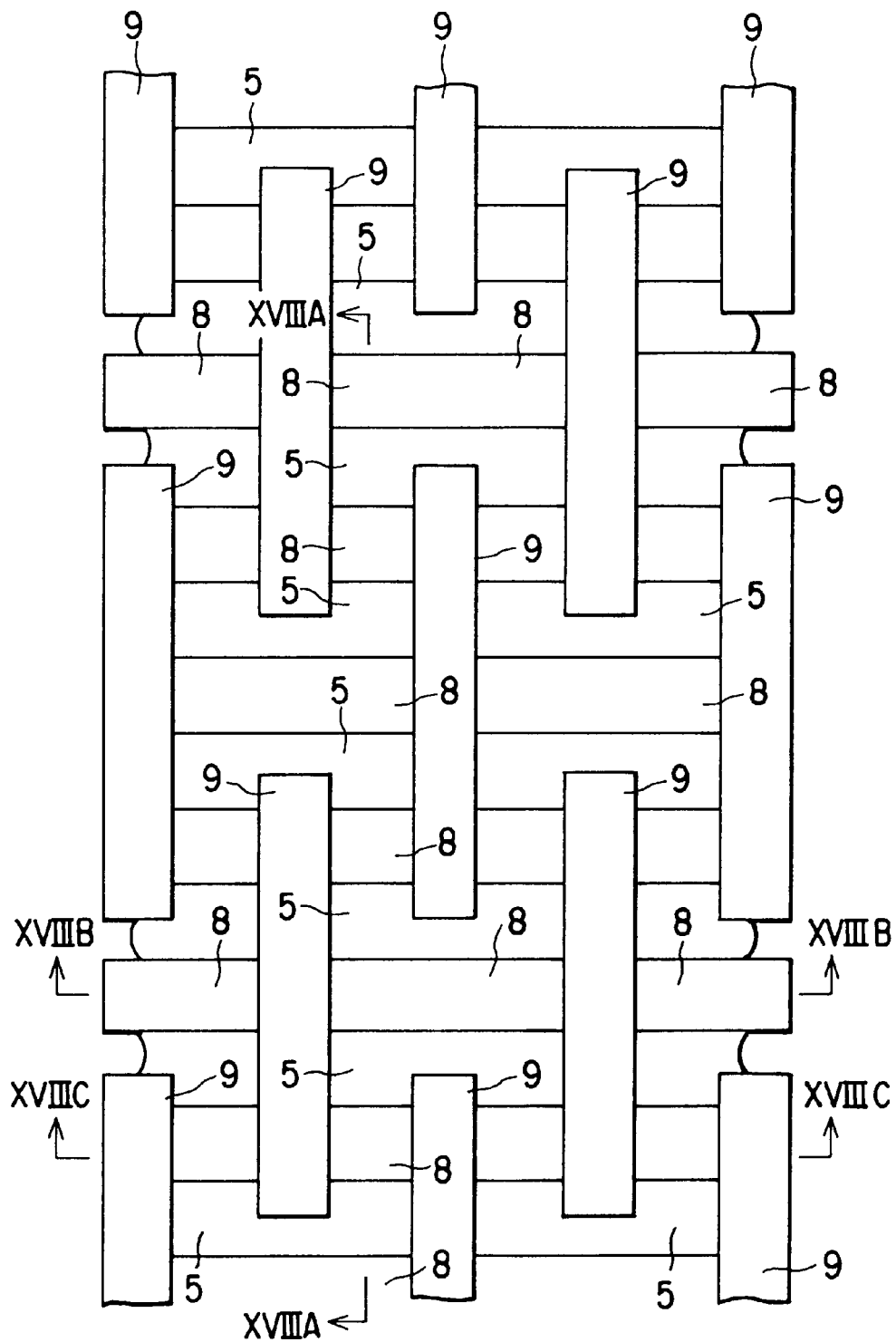
FIG. 19 is a plan view of the DRAM in the step shown in FIG. 18.

Next, as shown in FIGS. 18A to 18C, a resist pattern 9 used for forming plug electrodes is formed on the inter-level insulating film 8. In this case, a positive photoresist is used as a photoresist for forming the resist pattern 9. The plan view of the structure obtained in this step is shown in FIG. 19.

Figure 28:
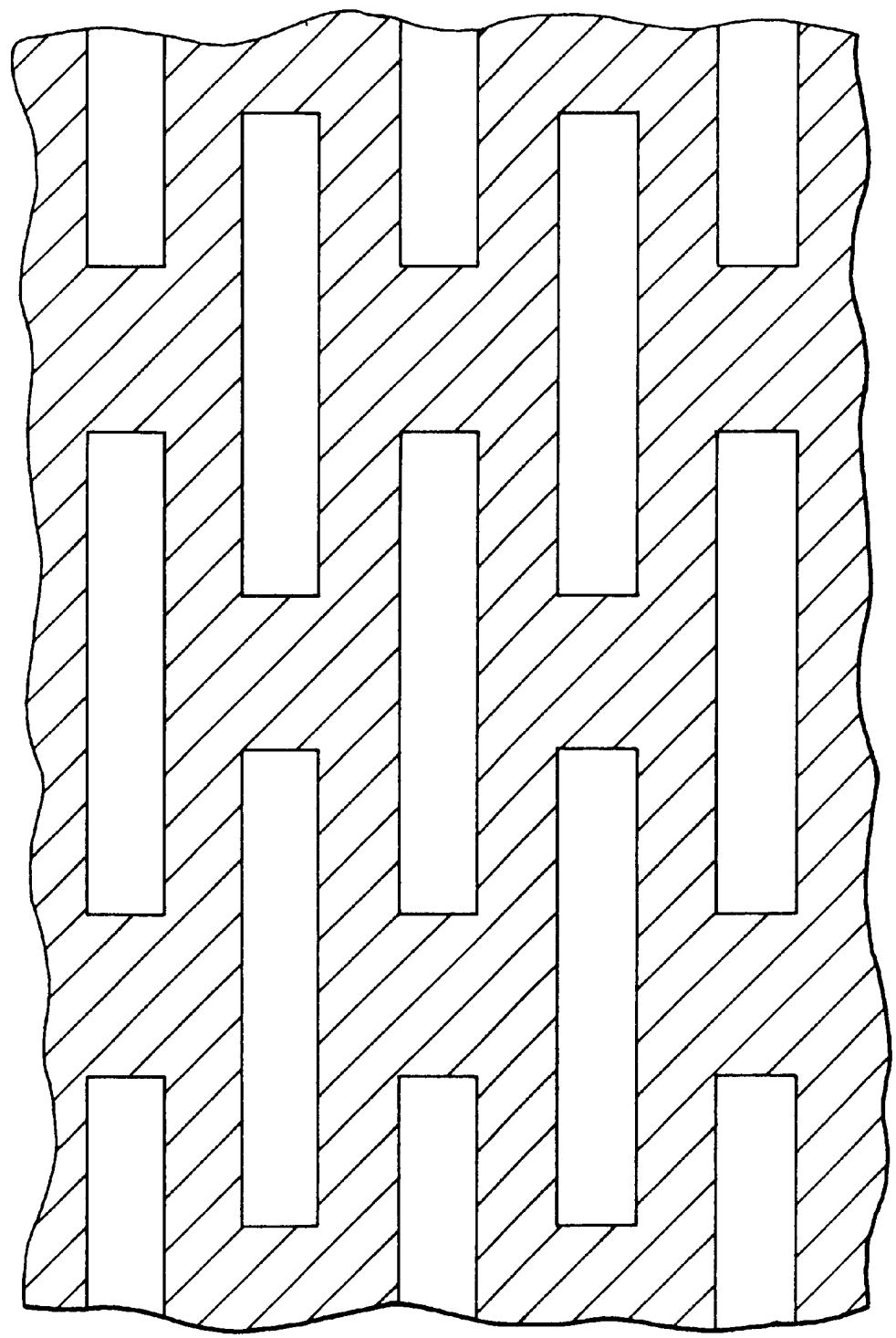
FIG. 28 is a view showing an exposure mask pattern for forming a resist pattern used for forming the DRAM of FIG. 13.
Figure 29:
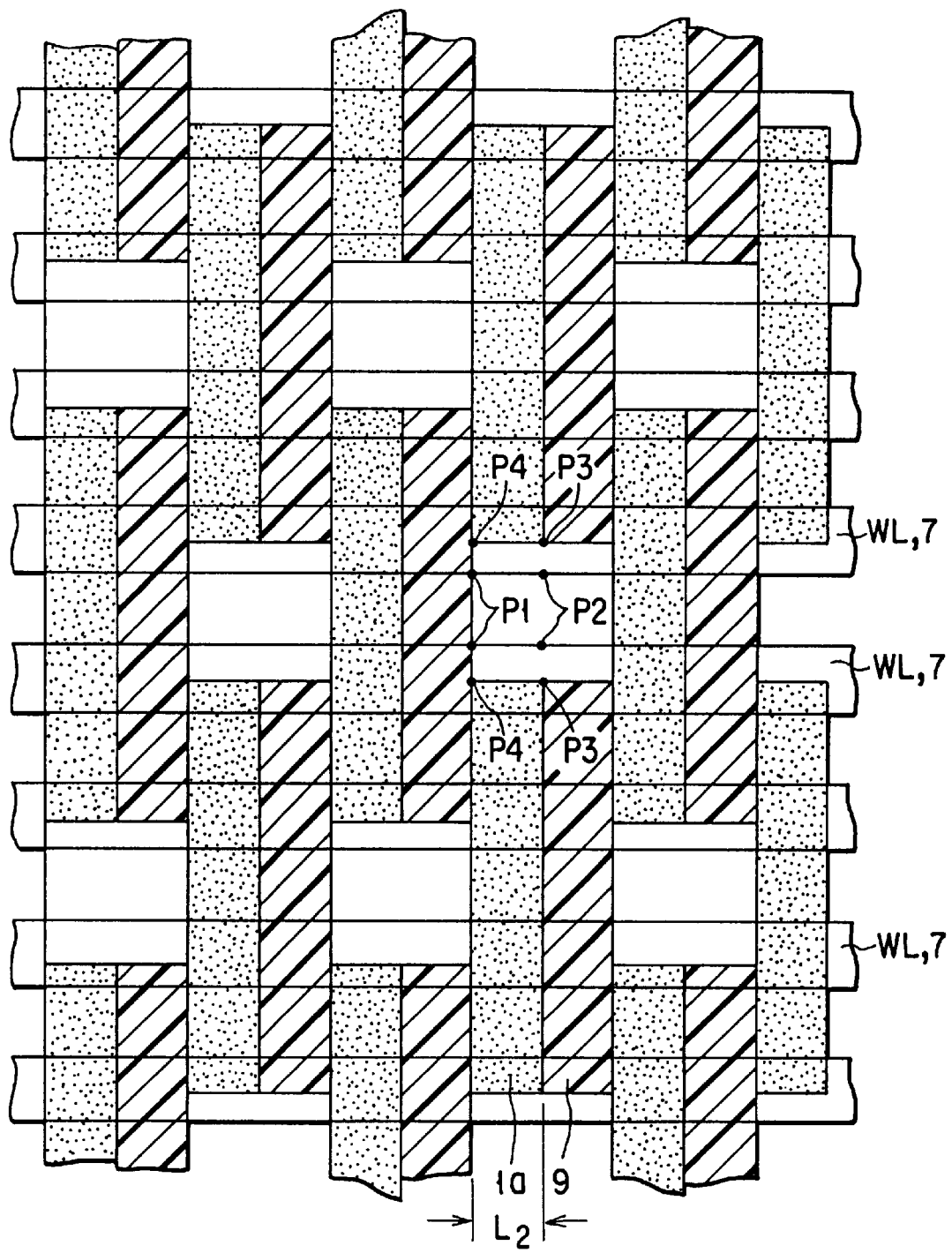
FIG. 29 is a plan view showing the positional relation between the resist pattern, active regions, word lines and gate side-wall insulating films formed by use of the exposure mask pattern of FIG. 28.

An exposure mask pattern (the hatched portion indicates an opening) for forming the resist pattern 9 is shown in FIG. 28, and the positional relation between the resist pattern 9, active regions 1a, word lines WL and gate side-wall insulating films 7 obtained at this stage is shown in FIG. 29.

Then, the inter-level insulating film 8 is etched with the gate upper-side insulating films 5, gate side-wall insulating films 7 and resist patterns 9 used as a mask until the substrate surface is exposed as shown in FIGS. 20A to 20C.

Figure 21:
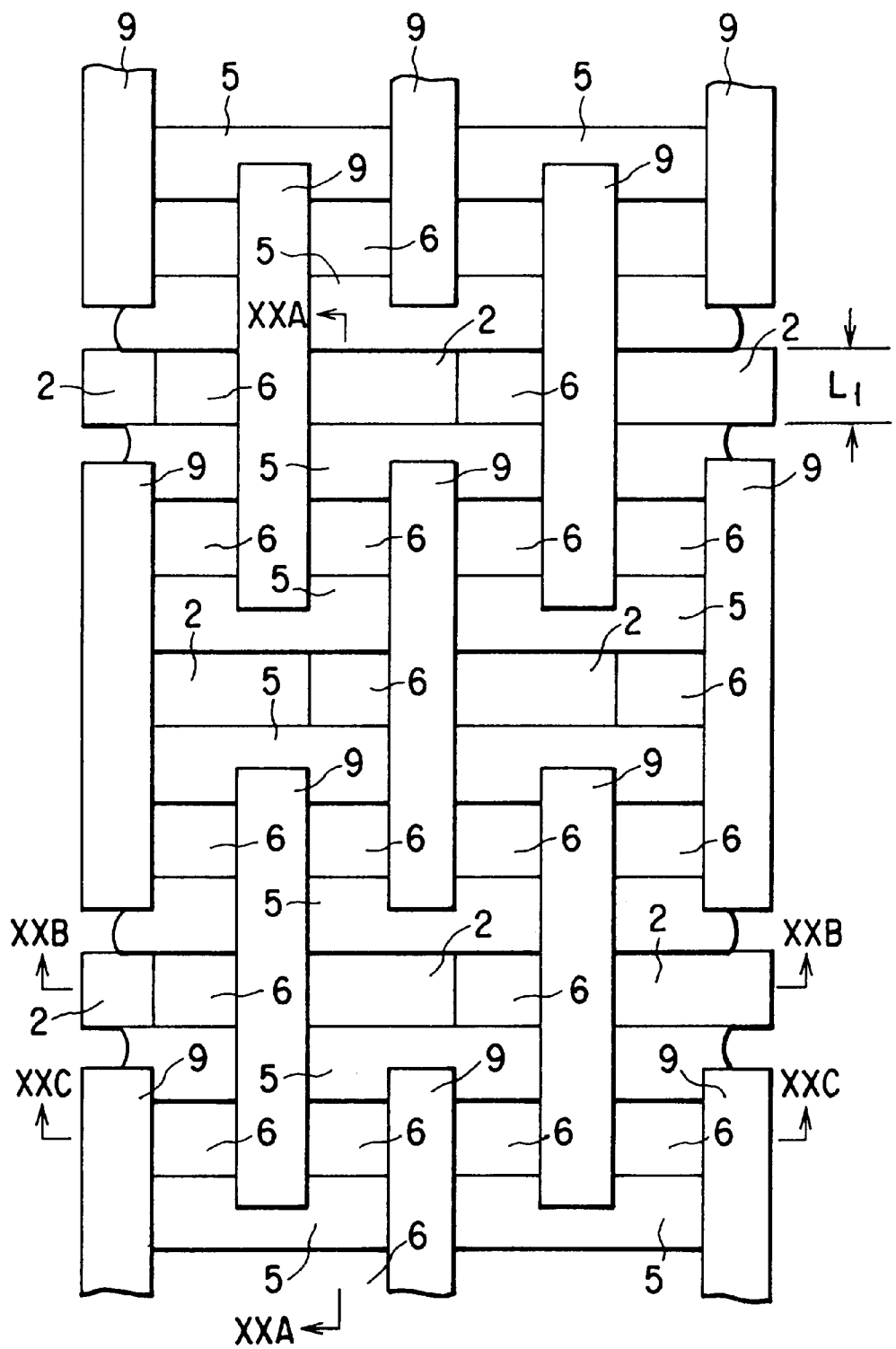
FIG. 21 is a plan view of the DRAM in the step shown in FIG. 20.

As a result, the substrate surface of each of BL plug contact areas BP used for forming bit line plug electrodes surrounded by the gate upper-side insulating films 5, gate side-wall insulating films 7 and resist pattern 9 and the substrate surface of each of SN plug contact areas SP used forming storage charge electrodes are exposed. The structure obtained at this stage is shown in FIG. 21.

In this embodiment, the gate upper-side insulating film 5 and gate side-wall insulating film 7 in an area between the BL plug contact area and an active region which intersects a passage word line in position deviated by 1/n (n>1) (for example, half pitch) of a distance in a word line extending direction between two active regions adjacent to each other in the array direction of the word lines from another active region in which the BL plug contact area is formed, for example, the gate upper-side insulating film 5 and gate side-wall insulating film 7 in an area defined by connecting points P1, P2, P3 and P4 in FIG. 29 are used as an etching mask.

That is, in this embodiment, the gate upper-side insulating film 5 and gate side-wall insulating film 7 in an area in which a resist was formed and which was not used as an etching mask in the prior art are used as an etching mask. As a result, a rectangular pattern shown in FIG. 29, that is, a pattern having no projecting portion can be used as the resist pattern 9.

The resist pattern 9 having no projecting portion can be formed by use of an exposure mask pattern having no projecting portion as shown in FIG. 28. Such an exposure mask pattern having no projecting portion can be transferred on the resist with high precision. Therefore, according to this embodiment, a memory cell can be obtained as designed and the high integration density can be easily attained.

The reason why the resist pattern 9 having no projecting portion can be used is that the dimension of the BL plug contact area BP in a direction parallel to the word line direction is set larger than F (minimum element isolation width).

Further, since the dimension of the BL plug contact area BP in a direction parallel to the word line direction is set smaller than three times the minimum element isolation width, there occurs no problem that the bit line plug electrode formed in a certain active region 1a will be connected to an adjacent active region 1a.

As shown in FIGS. 22A to 22C, a polysilicon film having impurity doped therein and used for forming the bit line plug electrodes 101 and storage charge plug electrodes 102 is formed on the entire surface, then the surface of the polysilicon film is etched back or set back by the etching or CMP process, and the bit line plug electrodes 101 are formed in the trenches of the BL plug contact area BP and the storage charge electrodes 102 are formed in the trenches of the SN plug contact area SP. After this, a second inter-level insulating film 11 is formed on the entire surface to make the surface flat.

Next, as shown in FIGS. 23A to 23C, openings are formed in the inter-level insulating film 11 on the central portion of the BL plug contact area BP, and then bit lines BL, bit line upper-side insulating films 12 and bit line side-wall insulating films 13 are formed. A method for forming the bit lines BL, bit line upper-side insulating films 12 and bit line side-wall insulating films 13 is the same as that for forming the gate electrodes 4, gate upper-side insulating films 5 and gate side-wall insulating films 7. The bit line upper-side insulating films 12 and bit line side-wall insulating films 13 are formed of a silicon nitride film, for example.

Figure 24A:
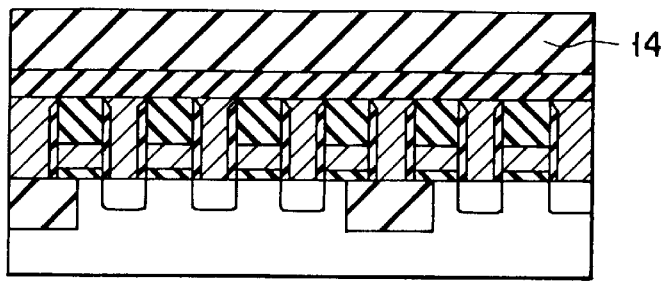
FIGS. 24A to 24C are cross sectional views for illustrating a step of the method for forming the DRAM of FIG. 13.
Figure 24B:
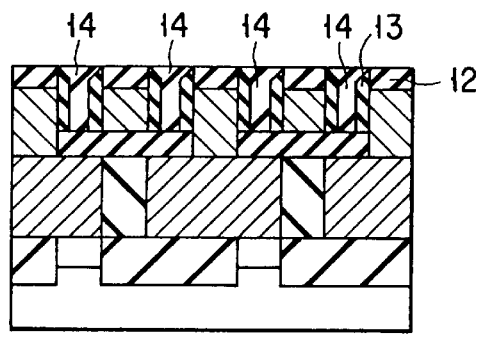
Figure 24C:
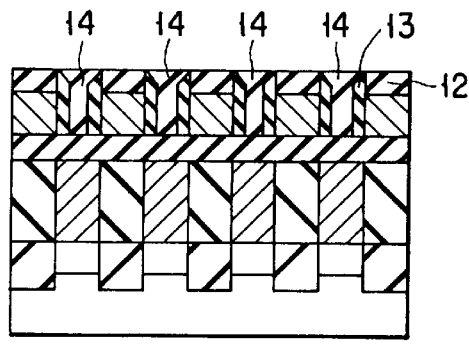

Next, as shown in FIGS. 24A to 24C, a third inter-level insulating film 14 is formed on the entire surface to make the surface flat. In this case, as a material of the inter-level insulating film 14, a material whose etching rate is higher than that of the bit line upper-side insulating film 12 and the bit line side-wall insulating film 13 is used.

Figure 25A:
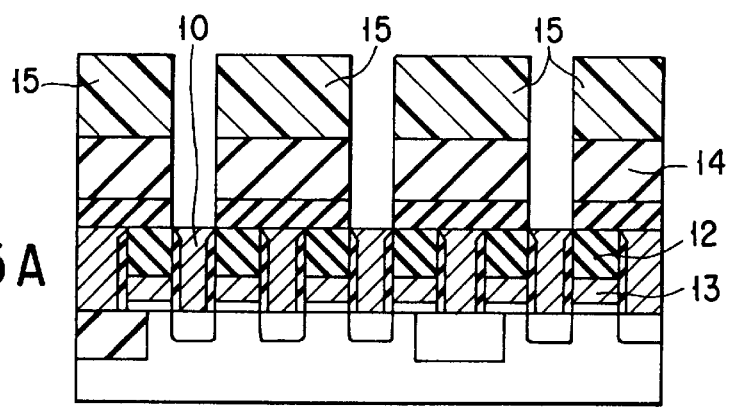
FIGS. 25A to 25C are cross sectional views for illustrating a step of the method for forming the DRAM of FIG. 13.
Figure 25B:
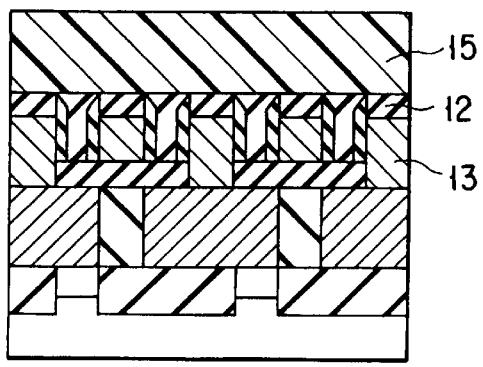
Figure 25C:
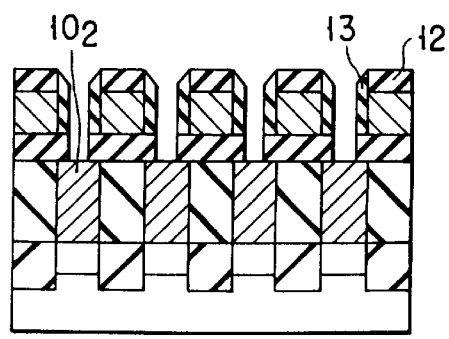

Next, as shown in FIGS. 25A to 25C, a photoresist pattern 15 is formed. As the photoresist pattern 15, linear patterns extending in a direction parallel to the word line and arranged in parallel to each other are used. Referring to FIG. 13, no resist is present in the cross section taken along the line XXVIIC—XXVIIC and the resist pattern 15 is formed in a linear form in the cross section taken along the line XXVIIB—XXVIIB.

Then, while the resist pattern 15, bit line upper-side insulating films 12 and bit line side-wall insulating films 13 are used as a mask, the inter-level insulating film 14 is processed by use of the RIE method so as to form contact holes used for connecting the storage charge electrodes 102 to storage charge electrodes which are formed in the next step.

Figure 26A:
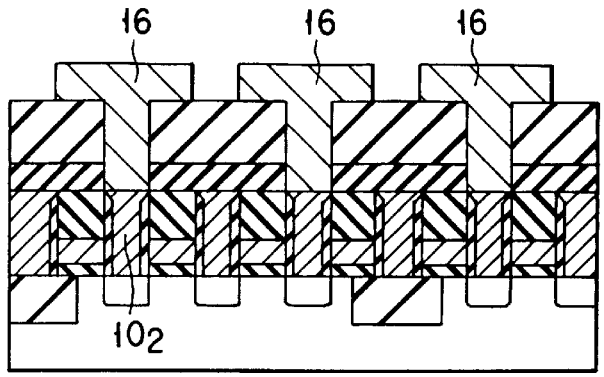
FIGS. 26A to 26C are cross sectional views for illustrating a step of the method for forming the DRAM of FIG. 13.
Figure 26B:
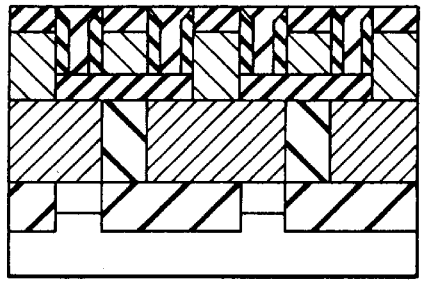
Figure 26C:
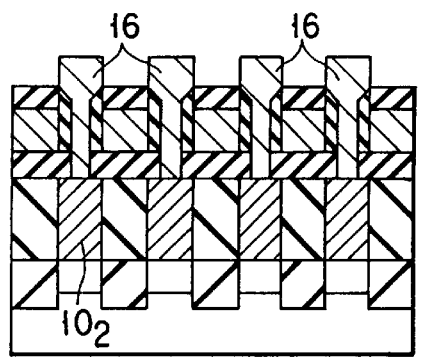
Figure 27A:
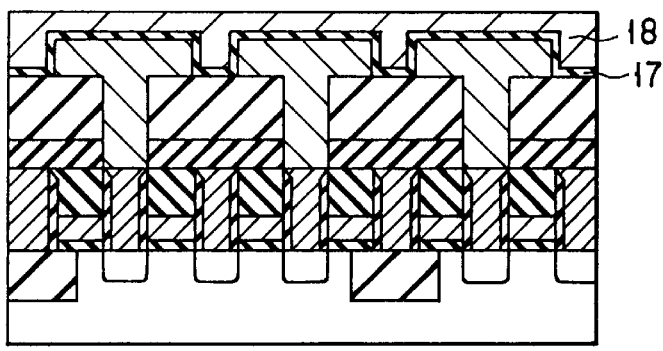
FIGS. 27A to 27C are cross sectional views for illustrating a step of the method for forming the DRAM of FIG. 13.
Figure 27B:
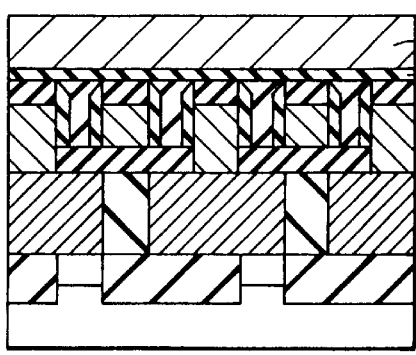
Figure 27C:
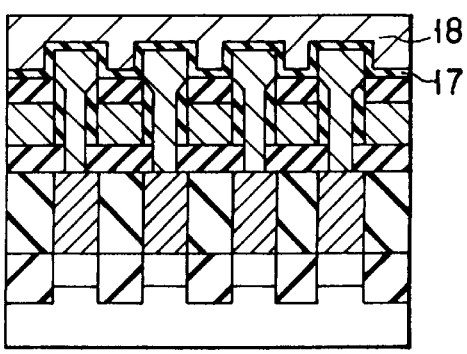

Next, after storage charge electrodes 16 are formed as shown in FIGS. 26A to 26C, a capacitor insulating film 17 and a plate electrode 18 are formed in this order on the entire surface as shown in FIGS. 27A to 27C. As a result, a stack type capacitor for storing a signal charge and constructed by the storage charge electrode 16, capacitor insulating film 17 and plate electrode 18 is completed. The process effected after this is the same as in the case of the normal DRAM process.

Figure 31:
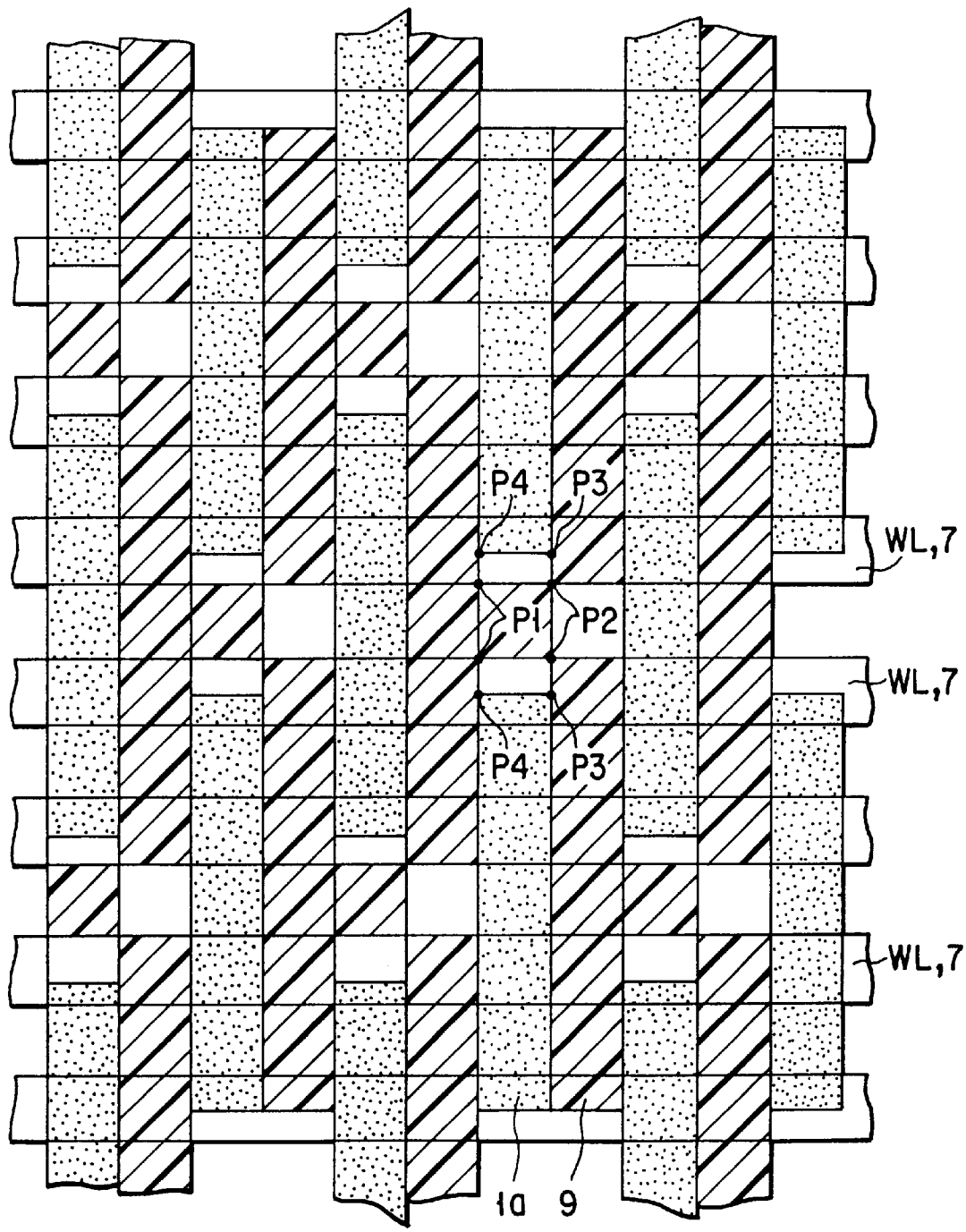
FIG. 31 is a plan view showing the positional relation between the resist pattern, active regions, word lines and gate side-wall insulating films formed by use of the exposure mask pattern of FIG. 30.

In this embodiment, the exposure mask which is open in an area other than the rectangular patterns is used, but an exposure mask pattern (the hatched portion is an opening portion) shown in FIG. 30 may be used. A view corresponding to that of FIG. 29 is shown in FIG. 31.

If the above exposure mask pattern is used, a distance between the bit line plug and an active region which lies adjacent to and is separated by a half pitch from an active region in which the bit line plug is formed becomes shorter, and as a result, the effect of reducing the parasitic capacitance and the like can be attained.

Further, the exposure mask pattern has a projecting portion, but in this embodiment, since the front end corner portion 20 of the projecting portion may be connected after transfer as shown in FIG. 32, no problem occurs (21 indicates opening portions). Therefore, the size of the projecting portion may be set smaller than the resolution of the lithography and it can be easily formed.

Figure 34:
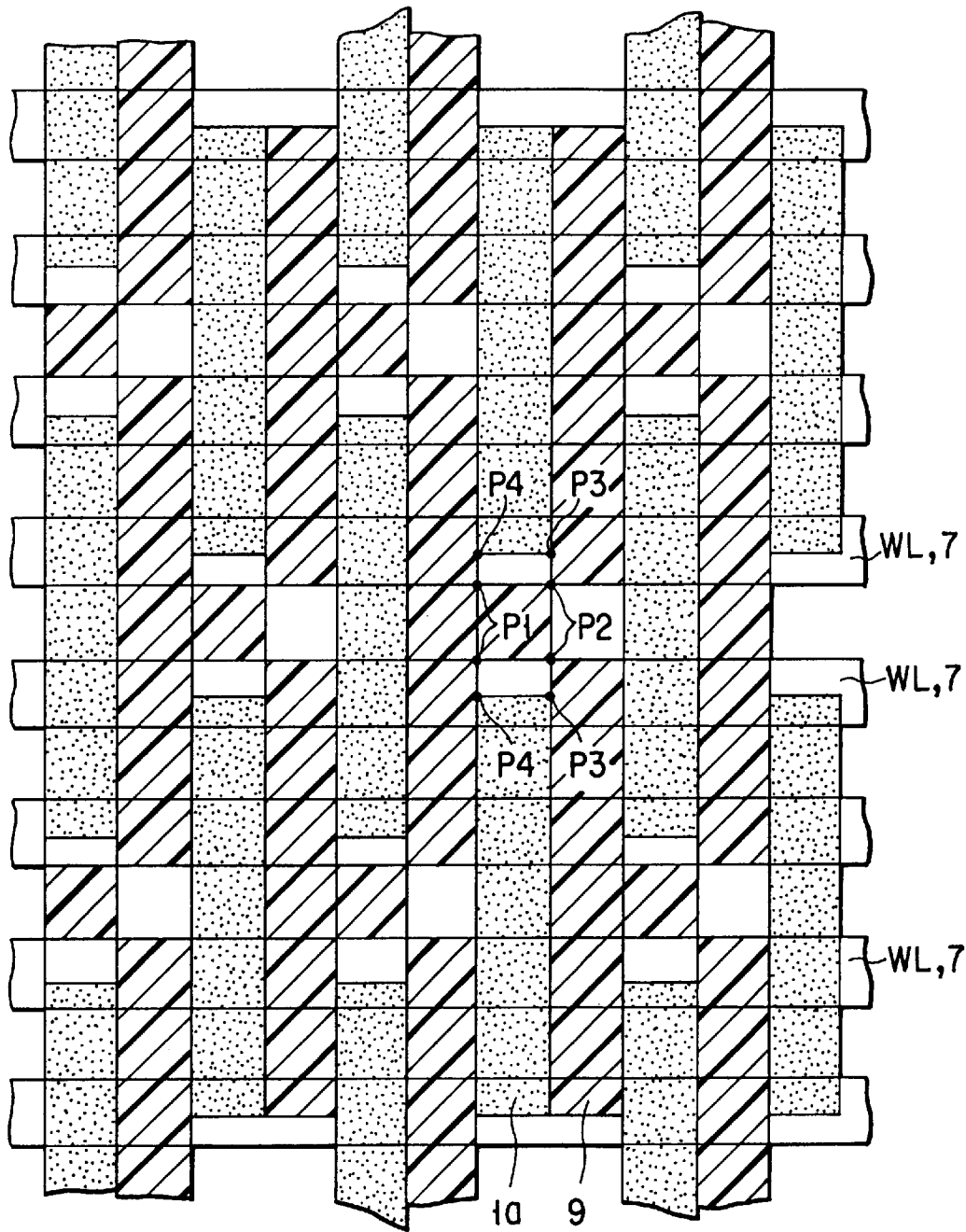
FIG. 34 is a plan view showing the positional relation between the resist pattern, active regions, word lines and gate side-wall insulating films formed by use of the exposure mask pattern of FIG. 33.

Further, it is possible to use an exposure mask pattern as shown in FIG. 33 (the hatched portion indicates an opening). A view corresponding to that of FIG. 29 is shown in FIG. 34.

If the above exposure mask pattern is used, the amount of exposure light in the corner portion 21 of the opening becomes small, and deterioration in the fidelity of the transferred pattern caused by rounding of the corner portion 21 can be prevented. Also, this exposure mask pattern has a projecting portion, but in this embodiment, the front end corner portion of the projecting portion may be connected after transfer, no problem occurs.

Second Embodiment

Figure 35:
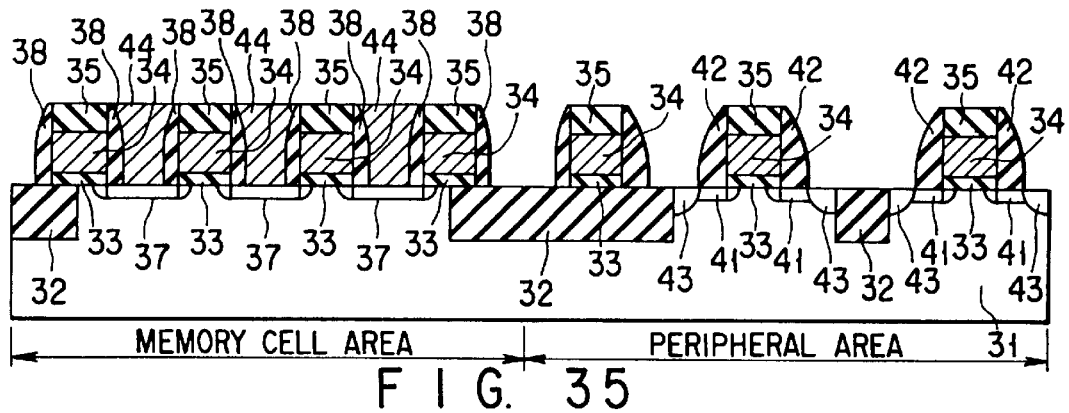
FIG. 35 is a cross sectional view showing MOS transistors in the memory cell area and peripheral area in a semiconductor device according to a second embodiment of the present invention.

FIG. 35 is a cross sectional view showing MOS transistors in the memory cell area and peripheral area in a semiconductor device according to a second embodiment of the present invention. The cross sectional view corresponds to a cross sectional view of FIG. 11C in the prior art case and a cross sectional view obtained at a stage in which source/drain electrodes are formed in the memory cell area is shown. MOS transistors in the peripheral area are MOS transistors in the peripheral area of a DRAM, MOS transistors of a logic device, or a combination of the above MOS transistors.

In FIG. 35, a reference numeral 31 denotes a p-type silicon substrate, and an element isolation insulating film 32 for element isolation (STI isolation) is buried in the surface portion of the p-type silicon substrate 31.

A plurality of MOS transistors are formed and arranged, respectively, in the memory cell area (first element region) and in the peripheral area (second element region). The plurality of MOS transistors in the memory cell area are serially connected.

Gate electrodes 34 are formed above the memory cell area and peripheral area with gate oxide films 33 disposed therebetween and silicon nitride films 35 are formed as gate cap insulating films on the gate electrodes 34.

Source/drain diffusion layers 37 of n type are formed in the substrate surface between the gate electrodes 34 in the memory cell area. Further, gate side-wall silicon nitride films 38 (first gate side-wall insulating films) which are set in direct contact with the gate electrodes 34 are formed in the memory cell area. Source/drain electrodes 44 are formed on the n-type source/drain diffusion layers 37 between the gate side-wall silicon nitride films 38.

Further, n-type source/drain diffusion layers (LDD) 41 are formed in the substrate surface between the gate electrodes 34 in the peripheral area and n-type source/drain diffusion layers 43 of higher impurity concentration are formed on the outer sides thereof. The impurity concentration of the n-type source/drain diffusion layer 43 is higher than that of the n-type source/drain diffusion layer 37 in the memory cell area.

The distance (the second distance between the gate electrodes) in the channel length direction between the gate electrodes 34 in the peripheral area is set longer than that (the first distance between the gate electrodes) in the memory cell area. Further, gate side-wall silicon nitride films 42 (second gate side-wall insulating films) which are set in direct contact with the gate electrodes 34 and formed thicker than the gate side-wall silicon nitride films 38 are formed in the peripheral area.

FIGS. 36A to 36C and FIGS. 37A to 37C are cross sectional views for illustrating steps of a method for forming the above MOS transistors.

Basically, the formation method is effected to prevent re-diffusion of impurity in the n-type source/drain diffusion layers 43 by forming the MOS transistors in the peripheral area after forming the MOS transistors in the memory cell area so as to cause the n-type source/drain diffusion layers of high impurity concentration in the peripheral area to be less subject to the influence of the heat treatment in the processing step for the memory cell area.

Figure 36A:
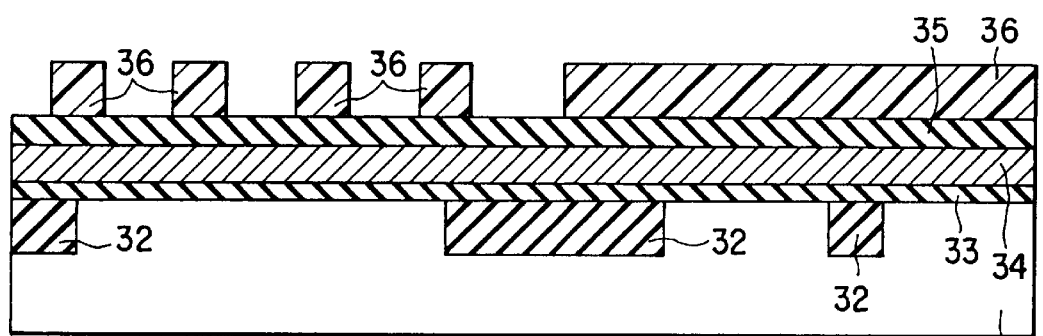
FIGS. 36A to 36C are cross sectional views for illustrating steps in the first half of a method for forming the MOS transistors of FIG. 35.

First, as shown in FIG. 36A, a shallow trench is formed in the surface portion of a p-type silicon substrate 31 and the element isolation (STI isolation) is made by filling an element isolation insulating film 32 in the trench.

Then, as shown in FIG. 36A, after a gate oxide film 33 is formed on the entire surface of the substrate, a polysilicon film 34 having impurity doped therein and used for forming gate electrodes and a silicon nitride film 35 used for forming gate cap insulating films are formed in this order on the gate oxide film 33.

Next, a resist pattern 36 for formation of gate electrodes is formed on the silicon nitride film 35. The resist pattern 36 is used for forming gate electrodes in the memory cell area and is formed to cover the polysilicon film 34 in the peripheral area.

Figure 36B:
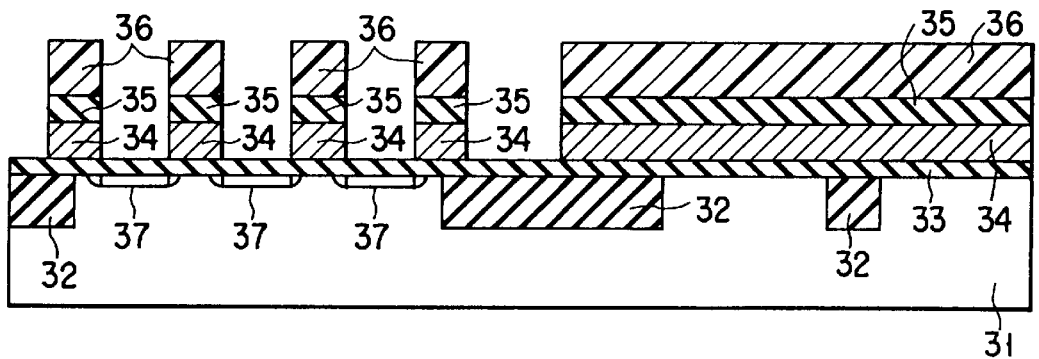

Next, as shown in FIG. 36B, the silicon nitride film 35, polysilicon film 34 are etched with the resist pattern 36 used as a mask so as to form gate cap insulating films 35 and gate electrodes 34 in the memory cell area. As the etching technique at this time, the anisotropic etching process such as RIE is used.

Then, n-type impurity is ion-implanted into the substrate surface with the resist pattern 36 used as a mask and the annealing process is effected to selectively form n-type source/drain diffusion layers 37 in the memory cell area.

Figure 36C:
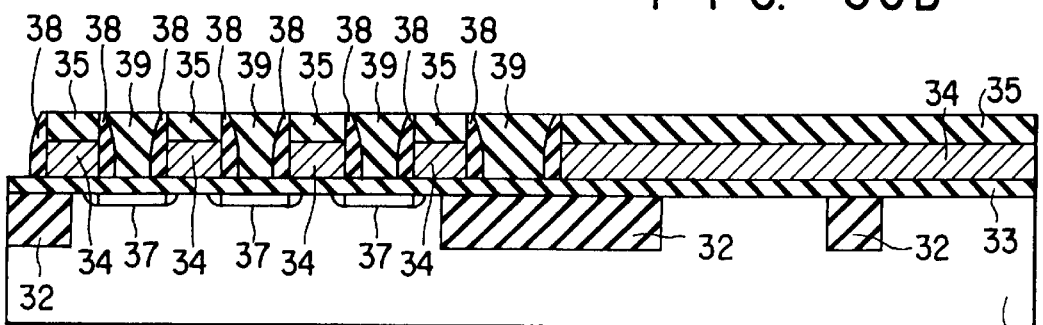

Next, as shown in FIG. 36C, the resist pattern 36 is removed and gate side-wall silicon nitride films 38 with a thickness suitable for the MOS transistors in the memory cell area are formed. The above gate side-wall silicon nitride films 38 can be formed by, for example, forming a silicon nitride film on the entire surface and selectively etching the entire surface of the silicon nitride film by use of the RIE method (that is, by leaving the side-wall portions).

Then, as shown in FIG. 36A, a silicon oxide film 39 used as an inter-level insulating film filled in the concave portions formed in the surface to make the surface flat is formed. The above silicon oxide film 39 can be formed by, for example, forming a silicon oxide film with a thickness larger than the depth of the concave portion in the surface and setting back or etching back the surface of the silicon oxide film to the upper surface of the gate cap insulating film 35 by use of the CMP or etching process.

Next, as shown in FIG. 37A, a resist pattern 40 for forming gate electrodes in the peripheral area is formed. The resist pattern 40 is formed to cover the memory cell area.

The resist pattern 40 can be formed without processing the memory cell area, that is, without forming the silicon oxide films 39 after gate side-wall silicon nitride films 38 are formed.

Next, as shown in FIG. 37B, the silicon nitride film 35 and polysilicon film 34 are etched with the resist pattern 40 used as a mask so as to form gate cap insulating films 35 and gate electrodes 34 in the peripheral area. As the etching process effected at this time, an anisotropic etching process such as RIE process is used.

Then, n-type impurity ion is implanted into the substrate surface with the resist pattern used as a mask so as to selectively form n-type source/drain diffusion layers (LDD) 41 in the peripheral area.

Next, as shown in FIG. 37C, the resist pattern 40 is removed and then an exposed portion of the gate oxide film 33 is removed by use of dilute hydrofluoric acid, for example.

Then, a silicon nitride film used for forming gate side-wall silicon nitride films 42 is formed on the entire surface and then gate side-wall silicon nitride films 42 with a thickness suitable for MOS transistors in the peripheral area are formed by subjecting the entire surface of the silicon nitride film to the RIE process. The thickness of the gate side-wall silicon nitride films 42 in the peripheral area is larger than that in the memory cell area.

Next, n-type impurity ion is implanted into the substrate surface with the silicon nitride films 35, 38, 42 and silicon oxide film 39 used as a mask so as to selectively form n-type source/drain diffusion layers 43 of high impurity concentration in the peripheral area.

Finally, after the silicon oxide film 39 in the peripheral area is selectively removed, source/drain electrodes 44 are formed in the memory cell area to complete the structure shown in FIG. 35. The process for selectively removing the silicon oxide film 39 may be effected by covering the peripheral area with a resist and then etching the silicon oxide film 39 in a condition that the etching rate thereof is set sufficiently higher than the etching rate of the gate side-wall silicon nitride film 38. The process effected after the above step is the same as that effected in the prior art case and steps such as a step of forming an inter-level insulating film and a step of forming source/drain electrodes in the peripheral area are effected.

In this embodiment, in the steps such as the step (annealing step) of forming the n-type source/drain diffusion layers 37 shown in FIG. 36B and the step of forming the silicon oxide film 39 shown in FIG. 36C, the n-type source/drain diffusion layers 37 of high impurity concentration are not yet formed in the peripheral area. Thus, in principle, there occurs no problem that impurity in the n-type source/drain diffusion layer 37 is re-diffused by heat generation caused in the above steps to deteriorate the element characteristic (device performance).

Figure 11A:
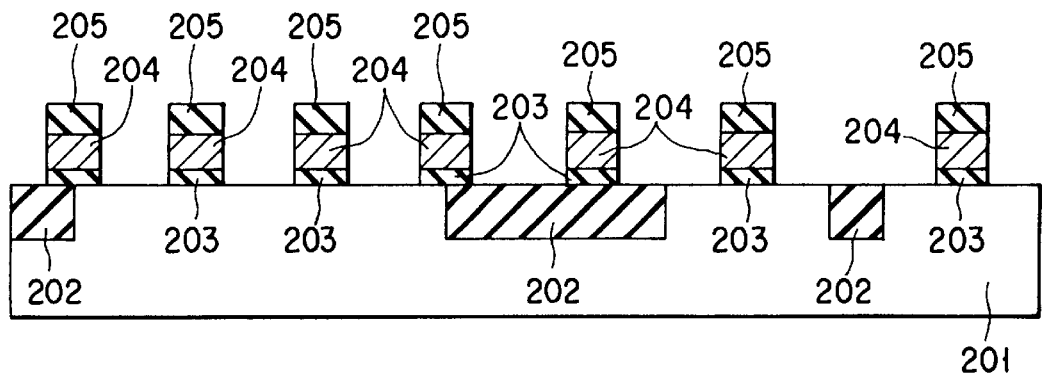
FIGS. 11A to 11C are cross sectional views for illustrating steps in the first half of a method for forming MOS transistors in the memory cell area and peripheral area in the conventional semiconductor device.
Figure 11B:
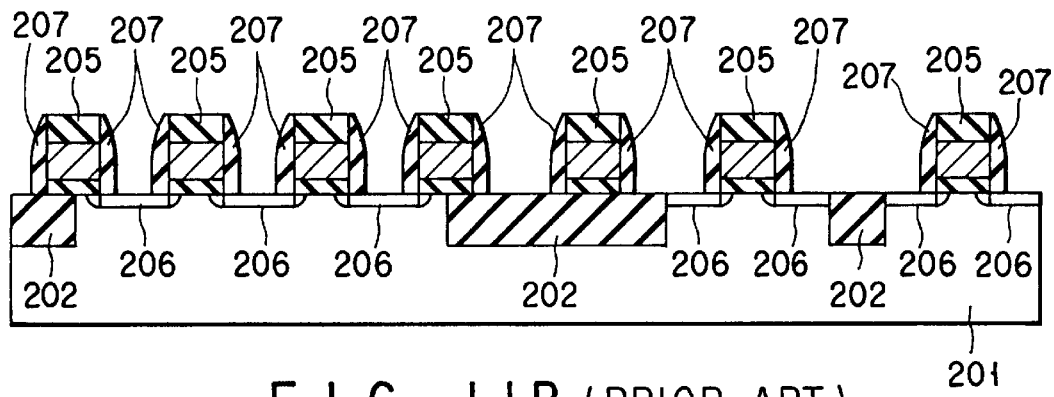

In the case of conventional method, as described before, the n-type source/drain diffusion layers 210 of high impurity concentration are already present in the peripheral area when the step of forming the inter-level insulating film 211 shown in FIG. 11A is effected. Therefore, there occurs a problem that impurity in the n-type source/drain diffusion layer 210 is re-diffused by heat generation caused by formation of the inter-level insulating film 211 to deteriorate the element characteristic (device performance).

Further, in the conventional method, the gate electrodes in the memory cell area and peripheral area are formed in one common lithography step, and in this embodiment, the gate electrodes in the memory cell area and peripheral area are formed in different lithography steps, but the number of photolithography steps is the same as in the prior art case.

Figure 11C:
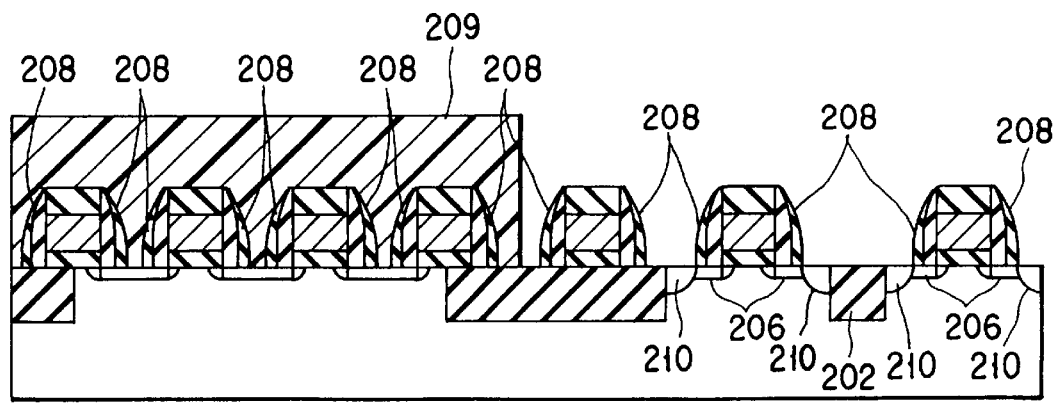
Figure 12A:
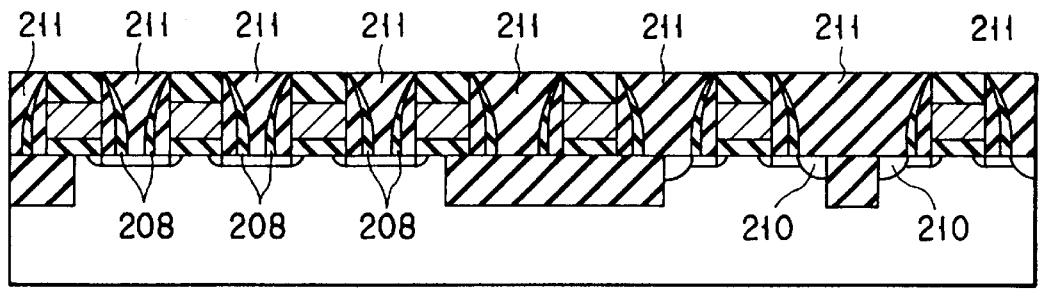
FIGS. 12A to 12C are cross sectional views for illustrating steps in the latter half of the method for forming the MOS transistors in the memory cell area and peripheral area in the conventional semiconductor device.
Figure 12B:
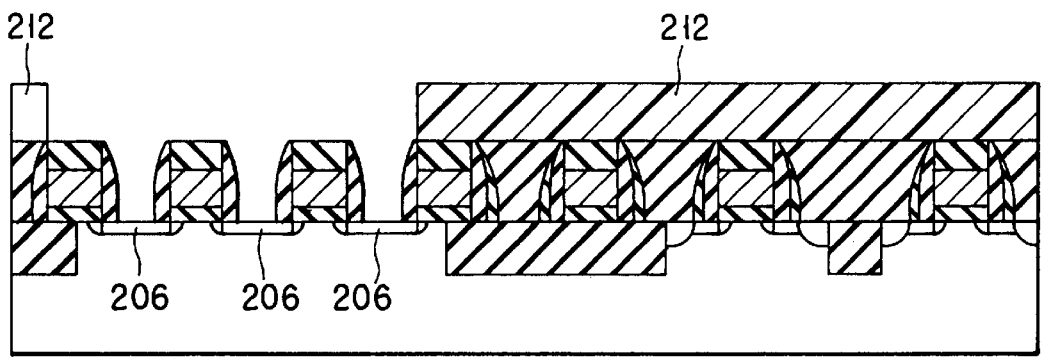
Figure 12C:
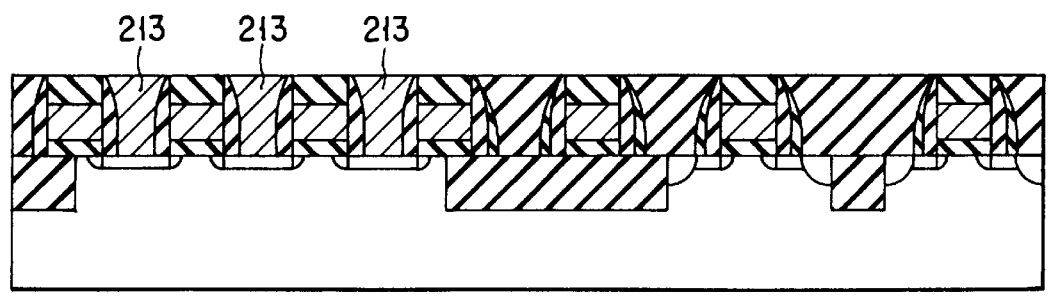

That is, if the process up to the step of forming the source/drain electrodes is taken into consideration, in this embodiment, the photolithography step is used in three steps including the step of FIG. 36A, the step of FIG. 37A and the step of forming the source/drain electrodes 44, and in the prior art case, the photolithography step is used in three steps including the step of FIG. 11A, the step of FIG. 11C and the step of FIG. 12B.

This is because, in this embodiment, the polysilicon film 34 on the memory cell area (peripheral area) is selectively etched to form the gate electrodes 34 in the memory cell area (peripheral area) by using the resist pattern 36 (40) which covers the peripheral area (memory cell area), impurity is selectively doped into the peripheral area (memory cell area) to form the n-type source/drain diffusion layers 37 (40) by using the resist pattern 36 (40) used in the above step as a mask.

That is, the gate electrodes and n-type source/drain diffusion layers can be formed by use of a common resist pattern. Therefore, even if the gate electrodes 34 in the memory cell area and peripheral area are formed by use of the different resist patterns 36, 40, it is possible to prevent an increase in the number of lithography steps. The n-type source/drain diffusion layers 43 can be formed in a self-alignment manner and a resist pattern is not required.

In the prior art case, the gate electrodes 204 in the memory cell area and peripheral area are formed by use of the common resist pattern 205, but another resist pattern is used to form the n-type source/drain diffusion layers 210.

Third Embodiment

Figure 38A:
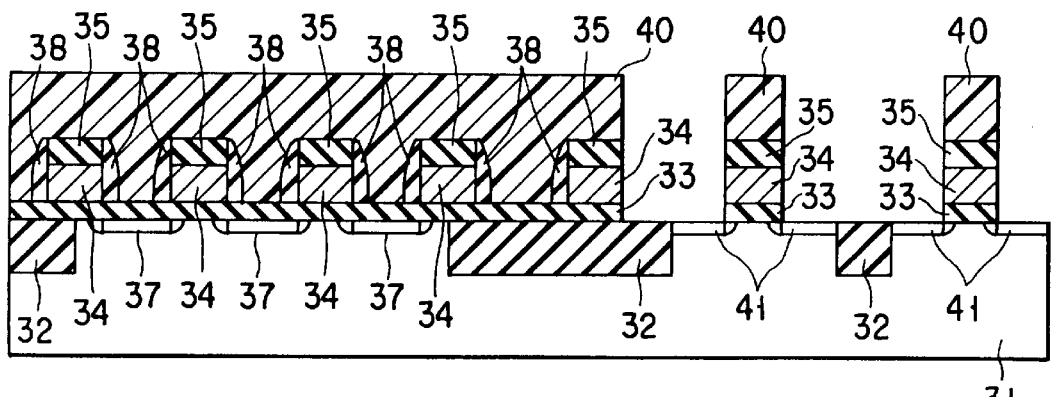
FIGS. 38A to 38C are cross sectional views for illustrating steps of a method for forming the MOS transistors in the memory cell area and peripheral area in a semiconductor device according to a third embodiment of the present invention.
Figure 38B:
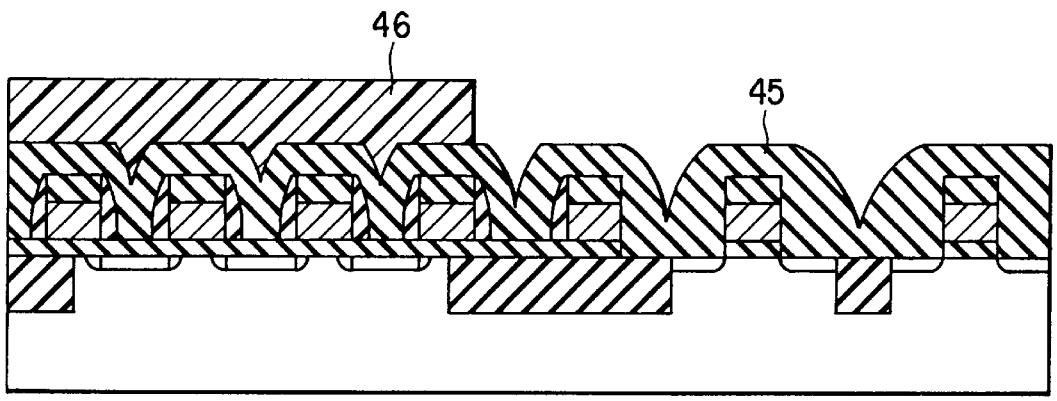
Figure 38C:
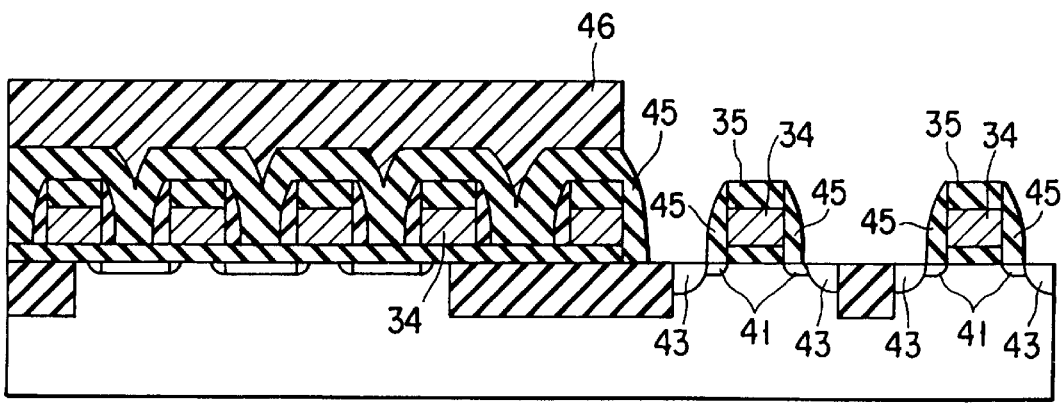

FIGS. 38A to 38C are cross sectional views for illustrating steps of a method for forming the MOS transistors in the memory cell area and peripheral area in a semiconductor device according to a third embodiment of the present invention.

The main difference between the second and third embodiments is that different types of gate side-wall insulating films are directly formed on the side walls of the gate electrodes in the memory cell area and peripheral area.

First, after the step of forming the gate side-wall nitride films 38 (first gate side-wall insulating films) shown in FIG. 36C in the second embodiment, a resist pattern 40 used for forming gate electrodes in the peripheral area is formed as shown in FIG. 38A.

Then, the silicon nitride film 35, polysilicon film 34 and gate oxide film 33 are etched with the resist pattern 40 used as a mask so as to form gate cap insulating films 35 and gate electrodes 34 in the peripheral area and expose the surface of the substrate in an area in which n-type source/drain diffusion layers 41 are to be formed.

Next, after n-type impurity ion is implanted into the exposed substrate surface with the resist pattern 40 used as a mask, the annealing process is effected to form the n-type source/drain diffusion layers 41 in the peripheral area.

Next, as shown in FIG. 38B, the resist pattern 40 is removed and then a silicon oxide film 45 (second gate side-wall insulating film) used for forming gate side-wall silicon oxide films in the peripheral area is formed on the entire surface. After this, a resist pattern 46 which covers the memory cell area is formed on the silicon oxide film 45.

Next, as shown in FIG. 38C, the silicon oxide film 45 is subjected to the RIE process with the resist pattern 46 used as a mask so as to form gate side-wall silicon oxide films 45 with a thickness suitable for MOS transistors in the peripheral area.

The gate side-wall silicon oxide film 45 is thicker than the gate side-wall silicon nitride film 42. Further, the gate side-wall silicon oxide film 45 is formed in direct contact with the side wall of the gate electrode 34 of the MOS transistor in the peripheral area and indirectly formed on the gate electrode 34 of the MOS transistor in the memory cell area with the gate side-wall nitride film 38 disposed therebetween.

If the gate side-wall silicon oxide film 45 is thus used as the gate side-wall insulating film instead of the gate side-wall silicon nitride film, the following effect can be obtained.

That is, if the gate side-wall silicon nitride film is used in a case where a polysilicon film having boron (B) doped therein is used to form the gate electrodes 34 in the peripheral area, penetration of boron through the gate oxide film 33 is accelerated, but if the gate side-wall silicon oxide film is used, such a problem of penetration of boron does not occur.

If penetration of boron occurs, the impurity concentration of the channel region changes, threshold voltage changes and the element is not operated as designed. Therefore, it is important to prevent penetration of boron.

Next, as shown in FIG. 38C, n-type impurity ion is implanted into the substrate surface to form source/drain diffusion layers 43 of high impurity concentration in the peripheral area with the gate cap insulating films 35, gate side-wall silicon oxide films 45 and resist pattern 46 used as a mask. In this case, it is possible to form the source/drain diffusion layers 43 by ion-implantation after the resist pattern 46 is removed.

Then, the resist pattern 46 is removed. The process effected after this step is the same as the process effected after the step of FIG. 37C in the second embodiment.

Also, in this embodiment, the same effect as that of the second embodiment can be attained. Further, according to this embodiment, since different types of insulating films can be selected as the gate side-wall insulating films formed in direct contact with the side walls of the gate electrodes 34 in the memory cell area and the gate side-wall insulating films in the peripheral area, a problem of penetration of boron does not occur even if the polysilicon film having boron doped therein is used as the gate electrode 34 in the peripheral area as described above.

It is possible to form the gate side-wall silicon oxide films 45 by subjecting the entire surface of the silicon oxide film 45 to the RIE process without forming the resist pattern 46. By using this method, it is possible to reduce the number of steps.

Fourth Embodiment

FIGS. 39A to 39C and FIGS. 40A to 40C are cross sectional views for illustrating steps of a method for forming MOS transistors in the memory cell area and peripheral area in a semiconductor device according to a fourth embodiment of the present invention. In this embodiment, after source/drain electrodes 44 are formed in the memory cell area, gate electrodes 35 are formed in the peripheral area.

Figure 39A:
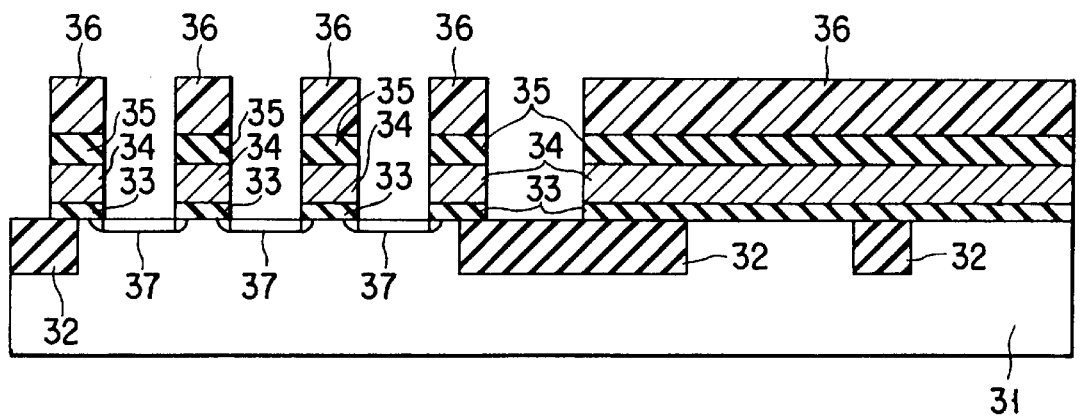
FIGS. 39A to 39C are cross sectional views for illustrating steps in the first half of a method for forming the MOS transistors in the memory cell area and peripheral area in a semiconductor device according to a fourth embodiment of the present invention.

First, after the step shown in FIG. 36A in the second embodiment, the silicon nitride film 35, polysilicon film 34 and gate oxide film 33 are etched with the resist pattern 36 used as a mask so as to form gate cap insulating films 35 and gate electrodes 34 in the memory cell area and expose the substrate surface of an area in which n-type source/drain diffusion layers 37 are to be formed as shown in FIG. 39A.

Next, n-type impurity ion is implanted into the exposed substrate surface to form n-type source/drain diffusion layers 37 in the memory cell area with the resist pattern 36 used as a mask.

Figure 39B:
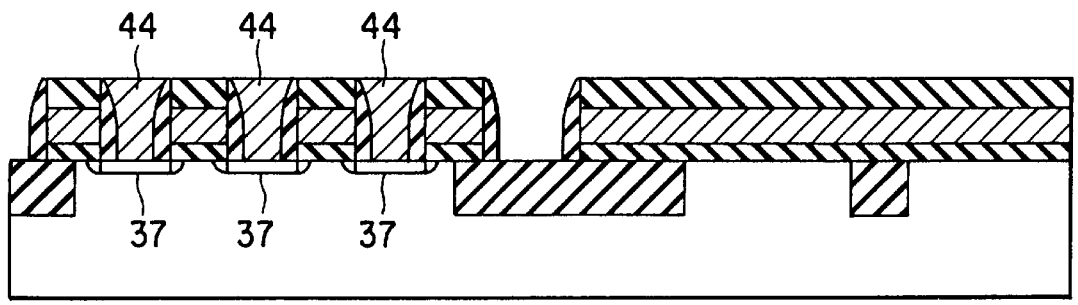

Next, as shown in FIG. 39B, the resist pattern 36 is removed and then source/drain electrodes 44 are formed on the n-type source/drain diffusion layers 37.

As a concrete method for forming the source/drain electrodes 44, for example, it is possible to use a method for first forming a polysilicon film having impurity doped therein on the entire surface, making the polysilicon film flat, making the height thereof equal to the height of the upper surface of the gate cap insulating film 35, and finally removing the polysilicon film in an area other than the n-type source/drain diffusion layers 37 by use of the photolithography and etching process.

In this case, the heat treatment (annealing process) for activating the impurity to lower the resistance of the polysilicon film is required, but since the heat treatment is effected before the source/drain diffusion layers of high impurity concentration are formed in the peripheral area, the impurity is prevented from being re-diffused.

Further, as another method, a method for selectively growing tungsten or silicon on the n-type source/drain diffusion layers 37 in an anisotropic manner so as to form the source/drain electrodes 44 in a self-alignment manner can be used. In this case, since it is not necessary to use the photolithography, the number of steps of photolithography can be reduced. Further, since the selective growth is effected before the source/drain diffusion layers of high impurity concentration are formed in the peripheral area, the impurity is prevented from being re-diffused.

Figure 39C:
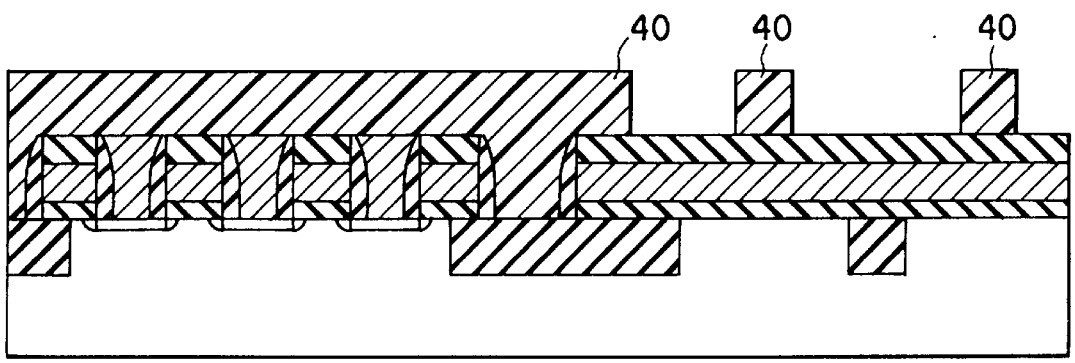

Next, as shown in FIG. 39C, a resist pattern 40 used for forming gate electrodes in the peripheral area is formed.

Then, the silicon nitride film 35 and polysilicon film 34 are etched with the resist pattern 40 used as a mask so as to form gate cap insulating films 35 and gate electrodes 34 in the peripheral area as shown in FIG. 40A. In this case, as the etching process, for example, an anisotropic etching process such as RIE is used.

Further, n-type impurity ion is implanted into the substrate surface to form n-type source/drain diffusion layers (LDD) 41 in the peripheral area with the resist pattern 40 used as a mask.

Next, as shown in FIG. 40B, after the resist pattern 40 is removed, an exposed portion of the gate oxide film 33 is removed by use of dilute hydrofluoric acid, for example.

Then, a silicon nitride film used for forming gate side-wall silicon nitride films 41 is formed on the entire surface and then the surface of the gate side-wall silicon nitride film is set back or etched back to the surface of the gate cap insulating films (silicon nitride films) 35 by use of the CMP or etching process so as to form gate side-wall nitride films 41 with a thickness suitable for MOS transistors in the peripheral area.

Next, n-type impurity ion is implanted into the substrate surface with the silicon nitride films 35, 41 and source/drain electrodes 44 used as a mask so as to form n-type source/drain diffusion layers 42 of high impurity concentration in the peripheral area.

The process effected after this is the same as that effected in the prior art case, and steps including a step of forming the inter-level insulating film and a step of forming source/drain electrodes in the peripheral area are effected.

Also, in this embodiment, the same effect as that of the second embodiment can be attained. Further, according to this embodiment, the following effect which cannot be attained in the second embodiment can be attained. That is, since the source/drain electrodes 44 are formed before the source/drain diffusion layers 42 of high impurity concentration in the peripheral area are formed, re-diffusion of impurity in the source/drain diffusion layers 42 caused by the step of forming the source/drain electrodes 44 can be prevented without fail. For example, it is possible to prevent re-diffusion of impurity caused by the heat treatment effected for shaping a conductive film used for forming the source/drain electrodes 44 after the conductive film is formed.

Further, if the source/drain electrodes 44 in the memory cell area are formed by selective growth, the number of photolithography steps can be reduced in comparison with the case of the first embodiment. More specifically, the number of photolithography steps can be set equal to that of a case wherein the gate side-wall insulating films with the same thickness are formed in the memory cell area and peripheral area. Further, a problem caused by misalignment of a mask will not occur. The mask alignment margin can be made small and the integration density can be further enhanced.

The present invention is not limited to the above embodiments. For example, in the first embodiment, a case wherein the width of the active region is set equal to the minimum element isolation width F is explained, but the width of the active region may be set larger than the minimum element isolation width F.

Figure 1:
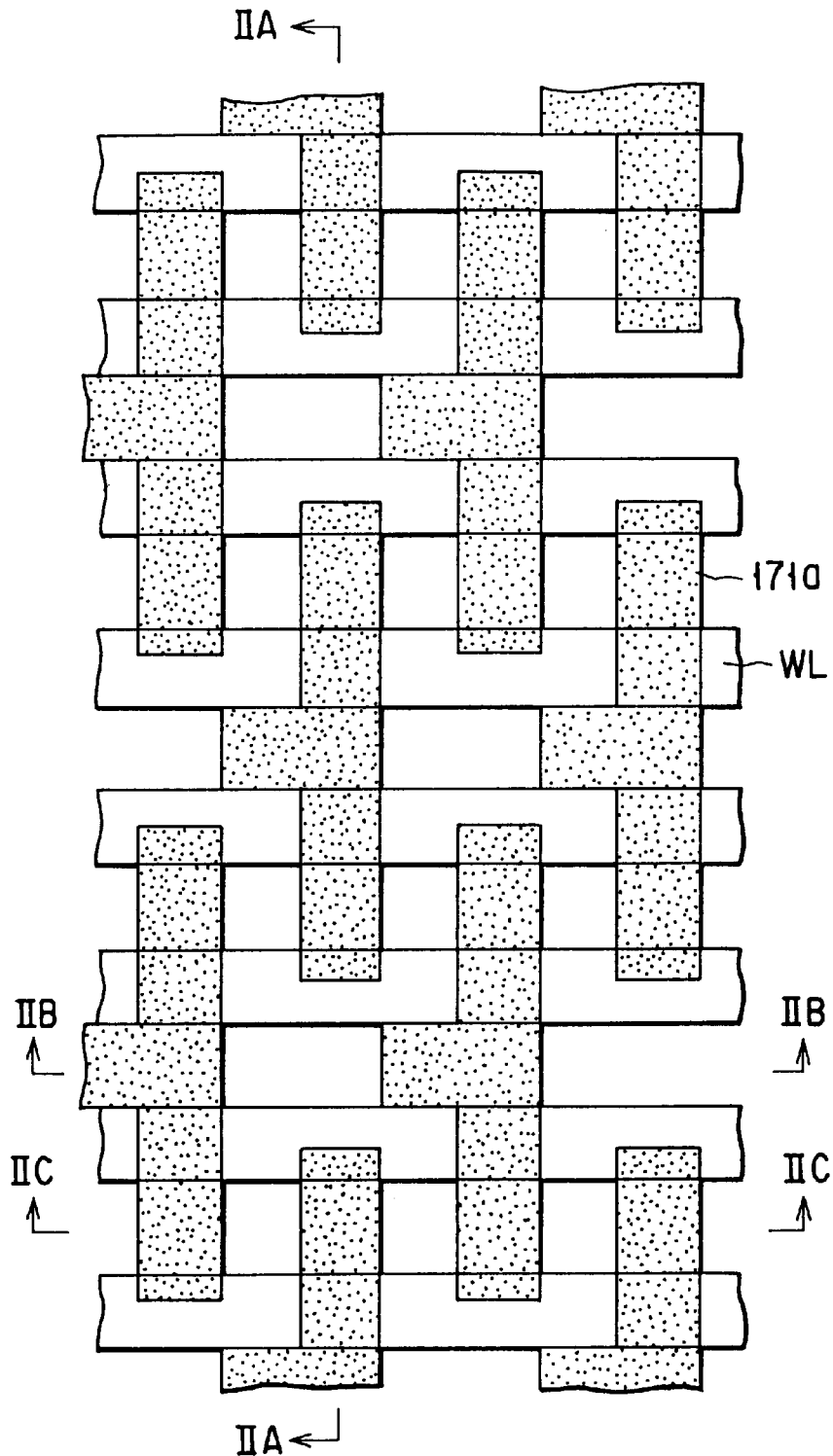
FIG. 1 is a plan view of a DRAM using conventional stack type memory cells.
Figure 2A:
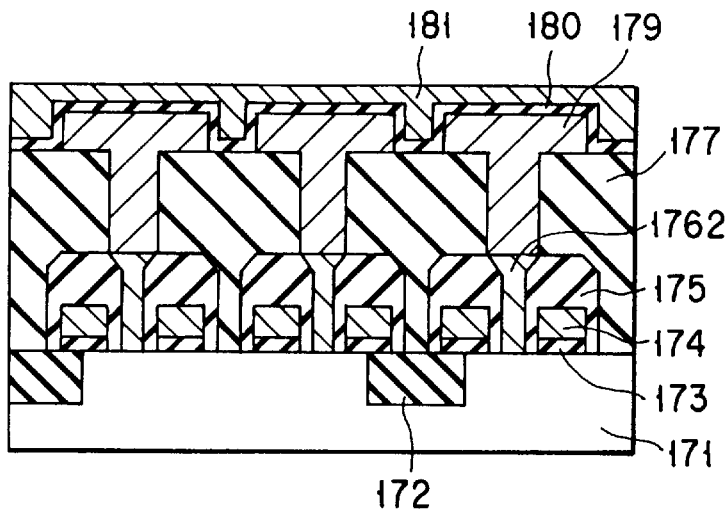
FIGS. 2A to 2C are cross sectional views of the DRAM shown in FIG. 1.
Figure 2B:
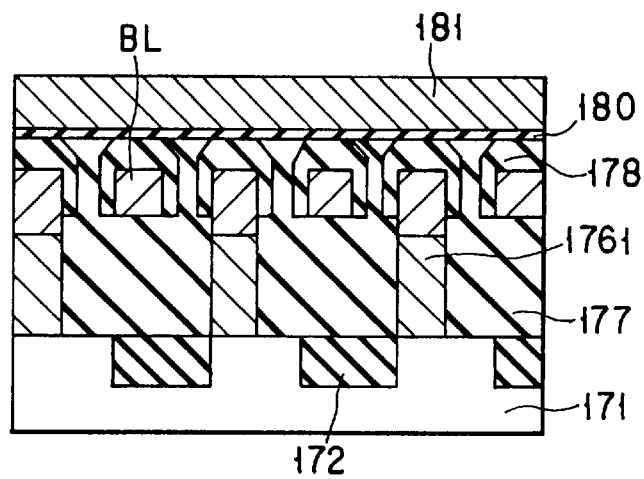
Figure 2C:
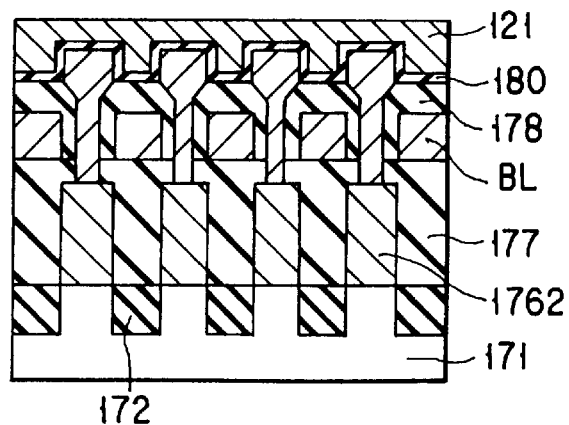
Figure 3:
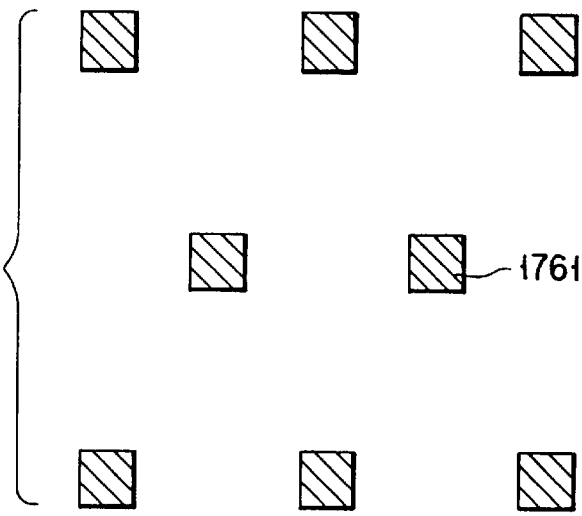
FIG. 3 is a view showing a pattern of bit line plug electrodes of the DRAM shown in FIG. 1.
Figure 4:
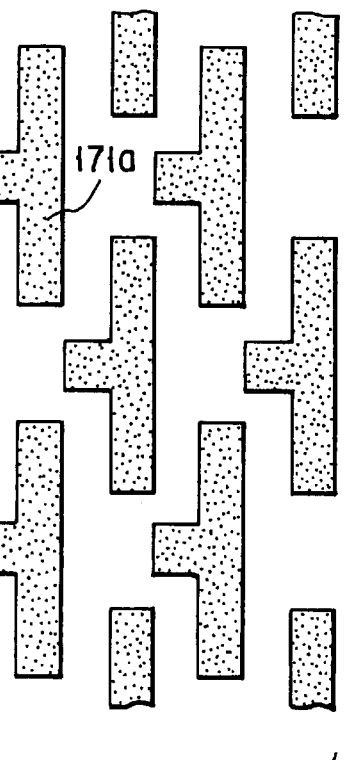
FIG. 4 is a view showing a pattern of active regions of the DRAM shown in FIG. 1.
Figure 5:
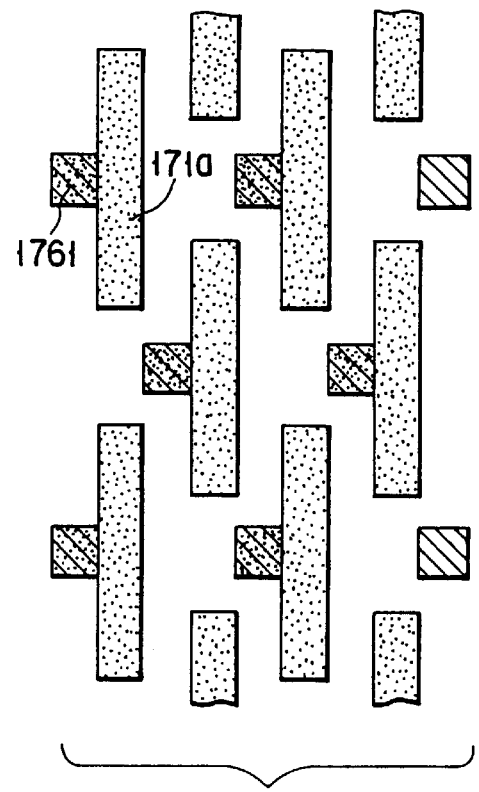
FIG. 5 is a plan view showing the positional relation between the bit line plug electrodes and the active regions of the DRAM shown in FIG. 1.
Figure 6:
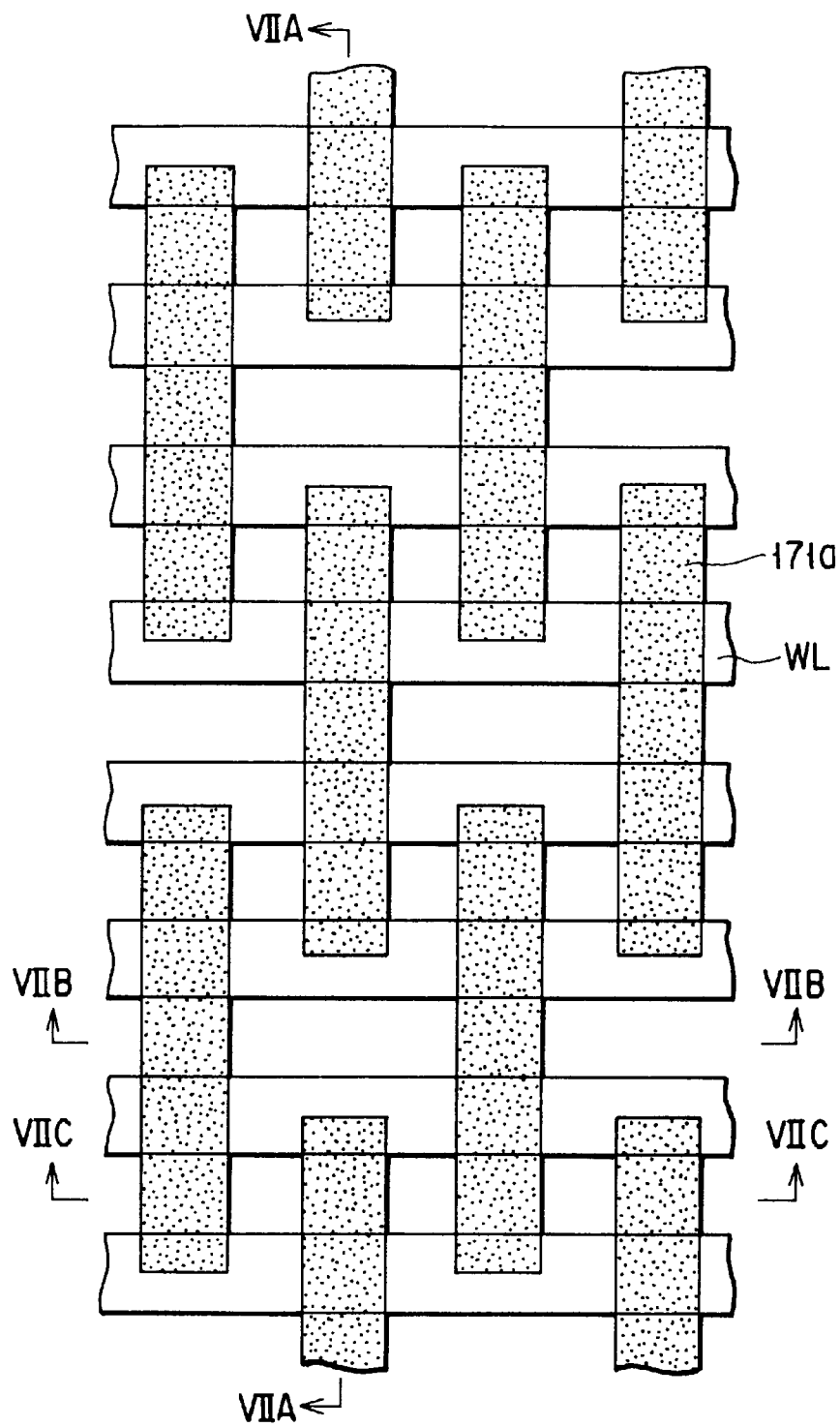
FIG. 6 is a plan view of a DRAM using other conventional stack type memory cells.
Figure 10:
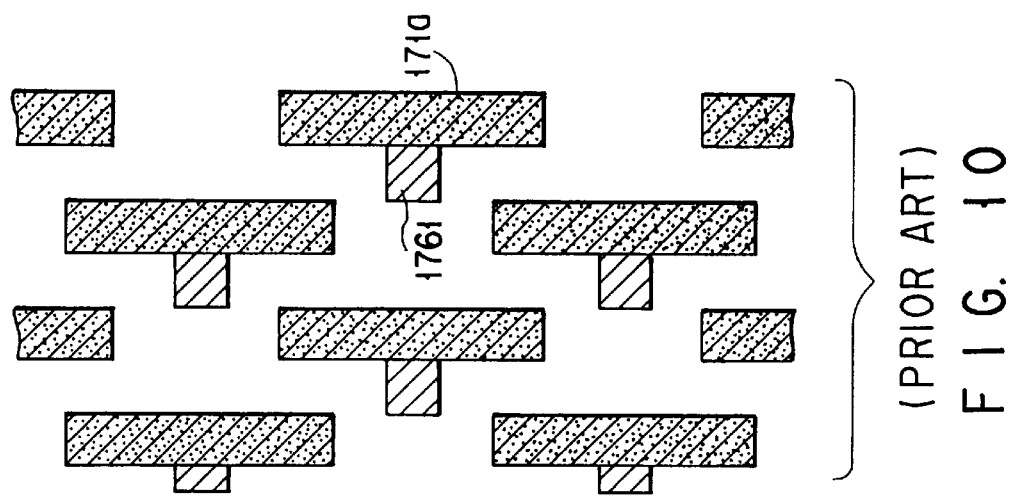
FIG. 10 is a plan view showing the positional relation between the bit line plug electrodes and the active regions of the DRAM shown in FIG. 6.
Figure 9:
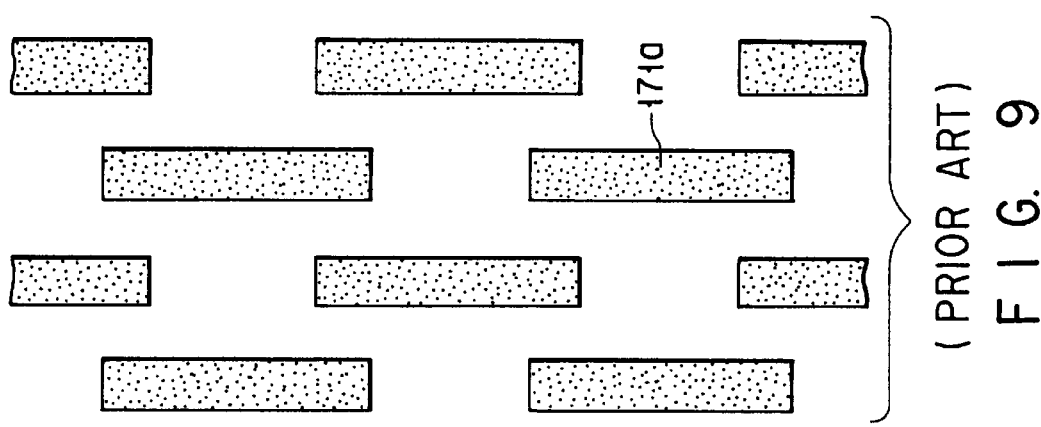
FIG. 9 is a view showing a pattern of active regions of the DRAM shown in FIG. 6.
Figure 8:
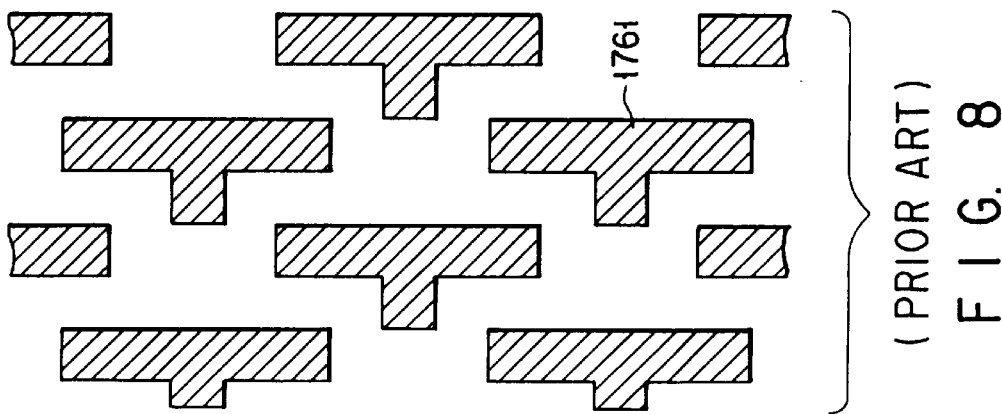
FIG. 8 is a view showing a pattern of bit line plug electrodes of the DRAM shown in FIG. 6.

Further, in the first embodiment, two MOS transistors are formed in each active region, but three or more MOS transistors may be formed in each active region. Also, the present invention can be applied to a case wherein bit line contacts are formed for the active regions 171*a* of a configuration shown in FIG. 4 and explained in the background art.

In the first embodiment, a method for forming bit lines below the capacitors and before formation of the capacitors is explained, but the present invention can be applied to a method for forming bit lines above capacitors and after formation of the capacitors.

Further, the present invention can be variously modified without departing from the technical scope thereof.

As described above, according to the present invention, since an exposure mask pattern which permits more precise transfer in comparison with the prior art case can be used by setting the length X of a region extending in a projecting form in the contact area in a direction in which a plurality of wiring groups extend larger than the width $L_1$ of the element isolation region in a direction in which the plurality of wiring groups extend, the high integration density can be more easily attained.

Further, since the relation of $X<2L_1+L_2$ is satisfied when the width of each of the plurality of active regions in the direction in which the plurality of wiring groups extend is set to $L_2$, a problem that a contact area for a certain active region extends over another active region does not occur.

In the present invention, basically, the MOS transistors in the second element region are formed after the MOS transistors in the first element region are formed. Therefore, the third diffusion layer is less subject to the influence by the heat treatment in the process for processing the first element region. As a result, it becomes possible to form MOS transistors having diffusion layers of impurity concentrations as designed in the first and second element regions, thereby making it possible to easily attain the high performance of the device (element).

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor device comprising:
   a plurality of active region groups regularly arranged on the surface of a semiconductor substrate;
   an element isolation region formed between said plurality of active region groups;
   a plurality of wiring groups arranged in parallel to one another on and intersecting said plurality of active region groups;
   a first insulating film formed to selectively cover said plurality of wiring groups; and
   a second insulating film formed to fill spaces between said plurality of wiring groups;
   wherein said plurality of active region groups are arranged and shifted from one another in the array direction of said plurality of wiring groups by a deviation amount of 1/n (n>1) of a distance between said plurality of active region groups in a direction in which said plurality of wiring groups extend, contact areas for each of said plurality of active region groups are each formed in an area extending in a projection form from each of said plurality of active region groups in a direction in which said plurality of wiring groups extend between adjacent wirings among said plurality of wiring groups, said second insulating film has openings on said contact areas and on areas of said plurality of active region groups between said plurality of wiring groups, contact electrode wiring layers are formed to fill the openings on said contact areas, and the length X of the area extending in the projection form in said contact area in the direction in which said plurality of wiring groups extend satisfies the relation of $L_1<X<2L_1+L_2$ when the width of each of said element isolation regions in the direction in which said plurality of wiring groups extend is set to $L_1$ and the width of one of said plurality of active regions in the above direction is set to $L_2$.

2. A device according to claim 1, wherein each of said plurality of active region groups includes source/drain regions of MOS transistors, said plurality of wiring groups include word lines, said contact electrode wiring layer is an electrode wiring layer for setting bit lines in contact with said contact areas.

3. A device according to claim 2, wherein each of said plurality of active region groups includes at least two MOS transistors, a corresponding one of said contact areas is formed to be electrically connected to a common source/drain region of said two MOS transistors and a stack type capacitor is electrically connected to the other source/drain region of said MOS transistors.

4. A semiconductor device comprising:
   a first area in which a plurality of first MOS transistors are formed and arranged with a first distance between gate electrodes in a channel length direction, wherein first gate side-wall insulating films are formed in direct contact with the side walls of the gate electrode of each of said first MOS transistors; and
   a second area in which a plurality of second MOS transistors having diffusion layers of impurity concentration higher than that of said first MOS transistors are formed and arranged with a second distance between gate electrodes longer than the first distance between the gate electrodes in the channel length direction, wherein second gate side-wall insulating films which are formed of the same type of film as said first gate side-wall insulating films and thicker than said first gate side-wall insulating films are formed in direct contact with the side walls of the gate electrode of each of said second MOS transistors.

5. A semiconductor device comprising:

a first area in which a plurality of first MOS transistors are formed and arranged with a first distance between gate electrodes in a channel length direction, wherein first gate side-wall insulating films are formed in direct contact with the side walls of the gate electrode of each of said first MOS transistors; and a second area in which a plurality of second MOS transistors having diffusion layers of impurity concentration higher than that of said first MOS transistors are formed and arranged with a second distance between gate electrodes longer than the first distance between the gate electrodes in the channel length direction, wherein second gate side-wall insulating films which are formed of a different type of film from that of said first gate side-wall insulating films are formed in direct contact with the side walls of the gate electrode of each of said second MOS transistors and said second gate side-wall insulating films are formed on the side walls of the gate electrode of each of said first MOS transistors with said respective first gate side-wall insulating films disposed therebetween and wherein said first gate side-wall insulating films are formed of silicon nitride films and said second gate side-wall insulating films are formed of silicon oxide films.

* * * * *